US010436956B2

(12) United States Patent
Fattal et al.

(10) Patent No.: US 10,436,956 B2
(45) Date of Patent: *Oct. 8, 2019

(54) GRATING APPARATUS FOR TARGET PHASE CHANGES

(71) Applicant: HEWLETT PACKARD ENTERPRISE DEVELOPMENT LP, Houston, TX (US)

(72) Inventors: David A Fattal, Mountain View, CA (US); Jingjing Li, Palo Alto, CA (US); Raymond G Beausoleil, Seattle, WA (US); Marco Fiorentino, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 345 days.

This patent is subject to a terminal disclaimer.

(21) Appl. No.: 15/224,417

(22) Filed: Jul. 29, 2016

(65) Prior Publication Data

US 2016/0341855 A1  Nov. 24, 2016

Related U.S. Application Data

(62) Division of application No. 13/383,267, filed as application No. PCT/US2009/051026 on Jul. 17, 2009, now Pat. No. 9,423,539.

(51) Int. Cl.
*G02B 5/18* (2006.01)
*G02B 27/00* (2006.01)
*G03F 7/00* (2006.01)

(52) U.S. Cl.
CPC ......... *G02B 5/1809* (2013.01); *G02B 5/1819* (2013.01); *G02B 5/1833* (2013.01);
(Continued)

(58) Field of Classification Search
CPC .. G02B 5/1809; G02B 5/1819; G02B 5/1861; G02B 5/1833; G02B 27/0012; G02B 5/1857; G03F 7/0005
See application file for complete search history.

(56) References Cited

U.S. PATENT DOCUMENTS 4,790,024 A   12/1988 Peppers et al.
4,829,172 A   5/1989 Miller
(Continued)

FOREIGN PATENT DOCUMENTS

CN   2571034 Y   9/2003
CN   1507684 A   6/2004
(Continued)

OTHER PUBLICATIONS

O'Shea et al. (Diffractive Optics: Design, Fabrication, and Test, Chapter 5: Design of Diffraction Gratings, 2003).*
(Continued)

*Primary Examiner* — Kimberly N. Kakalec
(74) *Attorney, Agent, or Firm* — Sheppard Mullin Richter & Hampton LLP

(57) ABSTRACT

Examples include a method for fabricating a grating mirror using a computing device that comprises calculating a target phase change across the grating mirror. The target phase change may correspond to a target wavefront shape in a beam of light reflected from a grating patter. The method may also comprise generating the grating pattern comprising a plurality of lines with line widths, line period spacings, and line thicknesses corresponding to the target phase change across the grating mirror using the computing device. In such examples, a set of coordinates may be generated using the computing device with each coordinate identifying a (Continued)

location of a line of the plurality of lines, a line width of the line, a line period spacing of the line, and a line thickness of the line.

20 Claims, 20 Drawing Sheets

(52) U.S. Cl.
CPC ......... G02B 5/1857 (2013.01); G02B 5/1861 (2013.01); G02B 27/0012 (2013.01); G03F 7/0005 (2013.01)

(56) References Cited

U.S. PATENT DOCUMENTS

| | | | |
|---|---|---|---|
| 5,140,149 | A | 8/1992 | Sakata et al. |
| 5,276,805 | A | 1/1994 | Hamaguchi |
| 5,323,268 | A | 6/1994 | Kikuchi |
| 5,726,805 | A | 3/1998 | Kaushik et al. |
| 5,742,433 | A | 4/1998 | Shiono et al. |
| 5,978,139 | A | 11/1999 | Hatakoshi et al. |
| 6,181,478 | B1 | 1/2001 | Mandella |
| 6,195,381 | B1 | 2/2001 | Botez et al. |
| 6,307,618 | B1* | 10/2001 | Suzuki ............... G03F 7/70308 355/53 |
| 6,417,968 | B1 | 7/2002 | Staub et al. |
| 6,590,267 | B1 | 7/2003 | Goodwin-Johansson et al. |
| 6,683,898 | B2 | 1/2004 | Oestergaard et al. |
| 6,697,405 | B2 | 2/2004 | Kitatani et al. |
| 6,707,548 | B2 | 3/2004 | Kreimer et al. |
| 6,741,624 | B2 | 5/2004 | Mears et al. |
| 6,785,320 | B1 | 8/2004 | Amos et al. |
| 6,818,959 | B2 | 11/2004 | Montelius et al. |
| 6,894,836 | B2 | 5/2005 | Christenson |
| 6,914,231 | B1 | 7/2005 | Stone |
| 6,977,765 | B1 | 12/2005 | Yeo |
| 7,096,498 | B2 | 8/2006 | Judge |
| 7,106,920 | B2 | 9/2006 | Liu |
| 7,173,764 | B2 | 2/2007 | Carr et al. |
| 7,180,930 | B2 | 2/2007 | Takaki et al. |
| 7,221,691 | B2 | 5/2007 | Johnson et al. |
| 7,302,130 | B2 | 11/2007 | Stone |
| 7,304,781 | B2 | 12/2007 | Chang-Hasnain et al. |
| 7,386,205 | B2 | 6/2008 | Wang et al. |
| 7,535,944 | B1 | 5/2009 | Guilfoyle et al. |
| 7,680,371 | B2 | 3/2010 | Cheben et al. |
| 7,693,205 | B2 | 4/2010 | Uchida |
| 9,093,819 | B2 | 7/2015 | Fattal et al. |
| 9,354,362 | B2* | 5/2016 | Li ...................... G02B 5/1809 |
| 2002/0073338 | A1 | 6/2002 | Burrows et al. |
| 2002/0080493 | A1 | 6/2002 | Tsai et al. |
| 2002/0149822 | A1 | 10/2002 | Stroud |
| 2002/0196428 | A1 | 12/2002 | Yamagata et al. |
| 2003/0048824 | A1 | 3/2003 | Shinagawa et al. |
| 2003/0206681 | A1 | 11/2003 | Polonskiy et al. |
| 2003/0227628 | A1 | 12/2003 | Kreimer et al. |
| 2003/0231395 | A1 | 12/2003 | Nakai |
| 2003/0235229 | A1 | 12/2003 | Deng et al. |
| 2003/0235370 | A1 | 12/2003 | Taillaert et al. |
| 2004/0140428 | A1 | 7/2004 | Ionescu et al. |
| 2005/0013334 | A1 | 1/2005 | Watanabe et al. |
| 2005/0015175 | A1* | 1/2005 | Huang ................... B29C 41/02 700/121 |
| 2005/0090029 | A1* | 4/2005 | Yamazaki ............ H01L 21/288 438/30 |
| 2006/0042483 | A1 | 3/2006 | Work et al. |
| 2006/0050392 | A1 | 3/2006 | Schulz |
| 2006/0076697 | A1 | 4/2006 | Lee et al. |
| 2006/0109540 | A1 | 5/2006 | Kueks et al. |
| 2006/0126183 | A1 | 6/2006 | Hasman |
| 2006/0187987 | A1 | 8/2006 | Nomoto et al. |
| 2006/0232776 | A1 | 10/2006 | Hairston et al. |
| 2006/0245464 | A1 | 11/2006 | Hori et al. |
| 2006/0262250 | A1 | 11/2006 | Hobbs |
| 2006/0273284 | A1 | 12/2006 | Hirose |
| 2006/0284052 | A1 | 12/2006 | Toshikiyo et al. |
| 2007/0013905 | A1 | 1/2007 | Brown |
| 2007/0115553 | A1 | 5/2007 | Chang-Hasnain et al. |
| 2007/0153860 | A1 | 7/2007 | Chang-Hasnain et al. |
| 2007/0165214 | A1 | 7/2007 | Wu et al. |
| 2007/0201527 | A1 | 8/2007 | Hori et al. |
| 2008/0084616 | A1 | 4/2008 | Katakura |
| 2008/0267236 | A1 | 10/2008 | Sigalas et al. |
| 2008/0317406 | A1 | 12/2008 | Santori et al. |
| 2009/0051930 | A1 | 2/2009 | Moulin et al. |
| 2009/0097122 | A1 | 4/2009 | Niv |
| 2009/0116790 | A1 | 5/2009 | Mossberg et al. |
| 2009/0196319 | A1 | 8/2009 | Hori et al. |
| 2009/0323195 | A1 | 12/2009 | Hembree et al. |
| 2009/0324248 | A1 | 12/2009 | Shiraki |
| 2010/0128749 | A1 | 5/2010 | Amann et al. |
| 2010/0182222 | A1* | 7/2010 | Ichihashi ............. G02B 5/1857 345/76 |
| 2010/0279446 | A1 | 11/2010 | Henrichs |
| 2010/0316083 | A1 | 12/2010 | Chang-Hasnain et al. |
| 2011/0096394 | A1 | 4/2011 | Liu et al. |
| 2011/0163336 | A1* | 7/2011 | Peng .................... G02B 5/1861 257/98 |
| 2011/0188119 | A1 | 8/2011 | Mathai et al. |
| 2012/0027339 | A1 | 2/2012 | Mathai et al. |
| 2012/0105962 | A1 | 5/2012 | Fattal et al. |
| 2012/0194911 | A1 | 8/2012 | Li et al. |

FOREIGN PATENT DOCUMENTS

| | | | |
|---|---|---|---|
| CN | 1595221 | | 3/2005 |
| CN | 1768253 | A | 5/2006 |
| CN | 1916668 | | 2/2007 |
| EP | 0534711 | A1 | 3/1993 |
| EP | 0537147 | B1 | 2/1995 |
| EP | 1616157 | B1 | 5/2012 |
| JP | 11-095017 | A | 4/1999 |
| JP | 2001033612 | A | 2/2001 |
| JP | 2009-188153 | A | 8/2009 |
| KR | 10-20080009280 | | 1/2008 |
| KR | 10-20080099172 | | 11/2008 |
| TW | 200811593 | A | 3/2008 |
| TW | 200927835 | A | 7/2009 |
| WO | WO-2006125196 | | 11/2008 |
| WO | WO2011008216 | | 1/2011 |
| WO | WO 2011037563 | A1 * | 3/2011 ........... G02B 5/1809 |
| WO | WO2012105945 | | 8/2012 |

OTHER PUBLICATIONS

Berseth, C.-A. et al., "Vertical cavity surface emitting lasers incorporating structured mirrors patterned by electron-beam lithography", J. Vac. Sci. Technol. B, Nov. 1999, vol. 17, No. 6, pp. 3222-3225 (200903198).

Chang-Hasnain, C. J. et al., "Tunable VCSEL Using High Contrast Grating", OSA CLE02009, May 2009 (200903198).

Christensen, et al., "Low-distortion hybrid optical shuffle concept", Optics Letters, Feb. 1, 1999, pp. 169-171, vol. 24, No. 3.

European Search Report (Supplementary), dated Apr. 26, 2013, EP Application No. 09849901.5.

Extended European Search Report received in EP Application No. 09847443.0, dated Nov. 27, 2015, 7 pages.

Fattal, David, et al., "Flat Dielectric Grating Reflectors with High Focusing Power", 8 pages, <http://arxiv.org/PScache/arxiv/pdf/1001/1 001.3711v1.pdf> Jan. 21, 2010.

Hewlett-Packard Development Company, L.P., "Non-Periodic Grating Reflectors with Focusing Power and Methods for Fabricating", Application No. PCT/US09/51026, Filed Jul. 17, 2009.

Hewlett-Packard Development Company, LP., "Optical Devices Based on Diffraction Gratings", Application No. PCT/US09/58006, Filed Sep. 23, 2009.

International Search Report and Written Opinion, dated Sep. 27, 2010, PCT Application No. PCT/US2010/022632.

International Search Report, dated Sep. 28, 2011, PCT Application No. PCT/US2011/023219.

(56) References Cited

OTHER PUBLICATIONS

International Search Report, dated Apr. 20, 2010, PCT Application No. PCT/US2009/051026.
International Search Report, dated May 31, 2010, PCT Application No. PCT/US2009/058006, Filed Sep. 23, 2009.
Marino, Francesco, et al., "Single Mode Operation and Transverse Mode Control in VCSELs Induced by Frequency Selective Feedback", 3 pages, Dept. de Fisica Interdisciplinar, I.
Srinivasan, Kartik, et al., "Fabrication-tolerant high quality factor photonic crystal microcavities." arXiv preprint physics/0312060 (2003).
Zhou, Ye, et al., "Transverse Mode Control in High-Contrast Subwavelength Grating VCSEL", 2 pages, Department of Electrical Engineering and Computer Sciences, University of Ca.
Ye Zhou et al., "Transverse Mode Control in High-Contrast Subwavelength Grating VCSEL", 2 pages, Dept. of Electrical Engineering and Computer Sciences, University of California, Berkeley, USA, May 6-11, 2007.
Shore B W et al: "Design of high-efficiency dielectric reflection gratings", Journal of the Optical Society of America, A, Optics and Image Science, Optical Society of America, US, vol. 14, No. 5, May 1, 1997 (May 1, 1997), pp. 1124-1136.
Michael C.Y. Huang et al: "A surface-emitting laser incorporating a high-index-contrast subwavelength grating", Nature Photonics, vol. 1, No. 2, Feb. 1, 2007 (Feb. 1, 2007), pp. 119-122.
Markus Amann: "Tuning triumph: Thin-membrane mirrors based on subwavelength gratings are transforming the performance of tunable VCSELs.", nature photonics : vol. 2 : Mar. 2008, Mar. 1, 2008 (Mar. 1, 2008), pp. 134-135, XP055231113, Retrieved from the Internet: URL:http://www.nature.com/nphoton/journal/v2/n3/pdf/nphoton.2008.15.
International Search Report and Written Opinion, dated Aug. 2, 2011. PCT Application No. PCT/US2010/054740.
International Search Report and Written Opinion received for PCT Patent Application No. PCT/US2010/022647, dated Sep. 29, 2010, 7 pages.
International Preliminary Report on Patentability received for PCT Patent Application No. PCT/US2011/023219, dated Aug. 15, 2013, 5 pages.
International Preliminary Report on Patentability received for PCT Patent Application No. PCT/US2010/022647, dated Aug. 9, 2012, 6 pages.
International Preliminary Report on Patentability received for PCT Patent Application No. PCT/US2010/022632, dated Aug. 9, 2012, 6 pages.
International Preliminary Report on Patentability received for PCT Patent Application No. PCT/US2009/058006, dated Apr. 5, 2012, 5 pages.
International Preliminary Report on Patentability received for PCT Patent Application No. PCT/US2009/051026, dated Jan. 26, 2012, 5 pages.
Francesco Marino et al., "Single Mode Operation and Transverse Mode Control in VCSELs Induced by Frequency Selective Feedback", 3 pages, Dept. de Fisica Interdisciplinar, Instituto Mediteraneo de Estudios Avanzados (CSIC-UIB), C/Miquel Marques 21, E-07190 Esporles, Spain.
Dennis W. Prather et al: "Vector-based synthesis of finite aperiodic subwavelength diffractive optical elements", Journal of the Optical Society of America , vol. 15, No. 6, Jan. 1, 1998 (Jan. 1, 1998), p. 1599.
David Fattal et al., "Flat Dielectric Grating Reflectors with High Focusing Power", 8 pages, <http://arvix.org/PScache/arxiv/pdf/1001/1001.3711v1.pdf>, Jan. 21, 2010.
Chang-Hasnain, C.J. et al., "High-Contrast Grating VCSELs", May/Jun. 2009, IEEE Journal of Selected Topics in Quantum Electronics, vol. 15, No. 3.

\* cited by examiner

GRATING APPARATUS FOR TARGET PHASE CHANGES

RELATED APPLICATIONS

This application is a divisional application of U.S. application Ser. No. 13/383,987, filed Jan. 10, 2012, which was the National Stage of International Application No. PCT/US09/51026, filed Jul. 17, 2009.

TECHNICAL FIELD

Embodiments of the present invention are directed to optical devices, and, in particular, to sub-wavelength grating reflectors.

BACKGROUND

Resonant effects in dielectric gratings were identified in the early 1990's as having promising applications to free-space optical filtering and sensing. Resonant effects typically occur in sub-wavelength gratings, where the first-order diffracted mode corresponds not to freely propagating light but to a guided wave trapped in some dielectric layer. The trapped wave is re-scattered in the $0^{th}$ diffracted order and interfaces with the incident light to create a pronounced modulation of transmission and reflection. When a high-index-contrast grating is used, the guided waves are rapidly scattered and do not propagate very far laterally. As a result, the resonant feature can be considerably broadband and of high angular tolerance, which has been used to design novel types of highly reflective mirrors. Recently, sub-wavelength grating mirrors have been used to replace the top dielectric stacks in vertical-cavity surface-emitting lasers, and in novel micro-electromechanical devices. In addition to being more compact and relatively cheaper to fabricate, sub-wavelength grating mirrors also provide polarization control.

Although in recent years there have been a number of advances in sub-wavelength gratings, designers, manufacturers, and users of optical devices continue to seek grating enhancements that broadening the possible range of grating applications.

DETAILED DESCRIPTION

Embodiments of the present invention are directed to planar sub-wavelength dielectric gratings ("SWGs") that can be configured to operate as mirrors and other optical devices. The SWGs are composed of two layers. The grating layer can be disposed on the surface of a substrate with the grating layer composed of a relatively higher refractive index material than the substrate or the grating layer can simply be fabricated in a suspended membrane without a substrate. SWGs configured in accordance with embodiments of the present invention provide new functionalities including phase front control. This can be accomplished by configuring the grating layer with a grating pattern to control phase changes in the light reflected from the SWG without substantially affecting the high reflectivity of the SWG. In certain embodiments, the grating layer can be configured so that the SWG can be operated as any type of optical device with an arbitrary reflecting surface. In particular, the grating layer of a SWG can be configured with a grating pattern enabling the SWG to be operated as a cylindrical mirror or a spherical mirror. Embodiments of the present invention also include methods and design rules for patterning the grating layer to generate a particular phase change across the mirror for the reflected beam using conventional lithography and etching techniques.

In the following description, the term "light" refers to electromagnetic radiation with wavelengths in the visible and non-visible portions of the electromagnetic spectrum, including infrared and ultra-violet portions of the electromagnetic spectrum.

I. Planar Sub-Wavelength Dielectric Gratings

Figure 1:
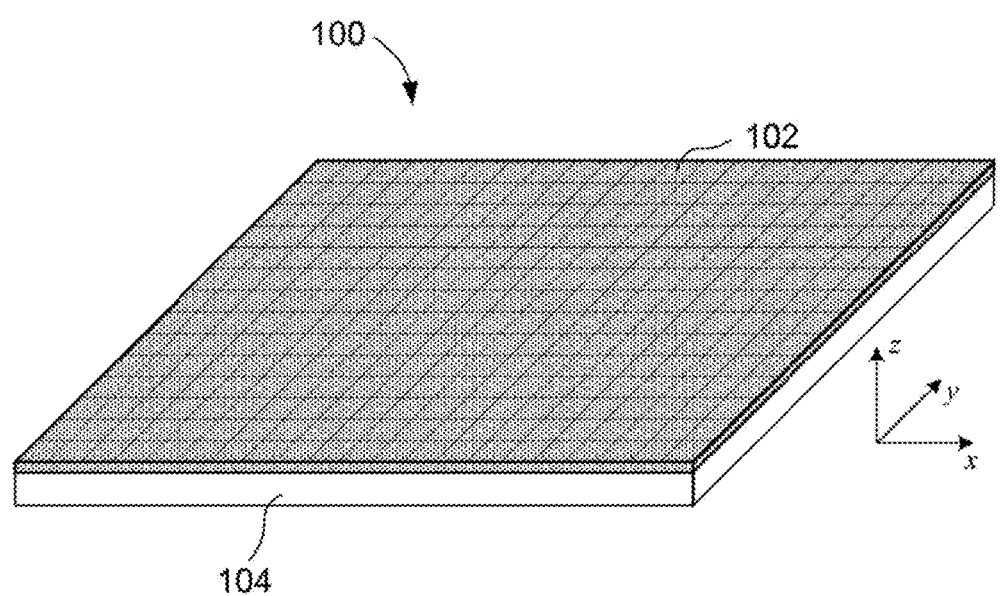
FIG. 1 shows an isometric view of a sub-wavelength grating configured in accordance with embodiments of the present invention.

FIG. 1 shows an isometric view of a SWG 100 configured in accordance with embodiments of the present invention. The SWG 100 includes a grating layer 102 disposed on a surface of a substrate 104, where the grating layer 102 is composed of a relatively higher refractive index material than the substrate 104. For example, the grating layer 102 can be composed of silicon ("Si") and the substrate 104 can be composed of quartz or silicon dioxide ("SiO$_2$"), or the grating layer 102 can be composed of gallium arsenide ("GaAs") and the substrate 104 can be composed of aluminum gallium arsenide ("AlGaAs") or aluminum oxide ("Al$_2$O$_3$"). As shown in the example of FIG. 1, the SWG 100 has a planar geometry, but the grating layer 102 can be configured with a particular grating pattern enabling the SWG 100 to be operated in the same manner as other optical devices, such as focusing and diverging cylindrical or spherical mirrors. In other embodiments, the substrate can be eliminated by forming the grating layer 102 in a single membrane comprising Si, GaAs, indium phosphide ("InP"), or another suitable material.

Figure 2:
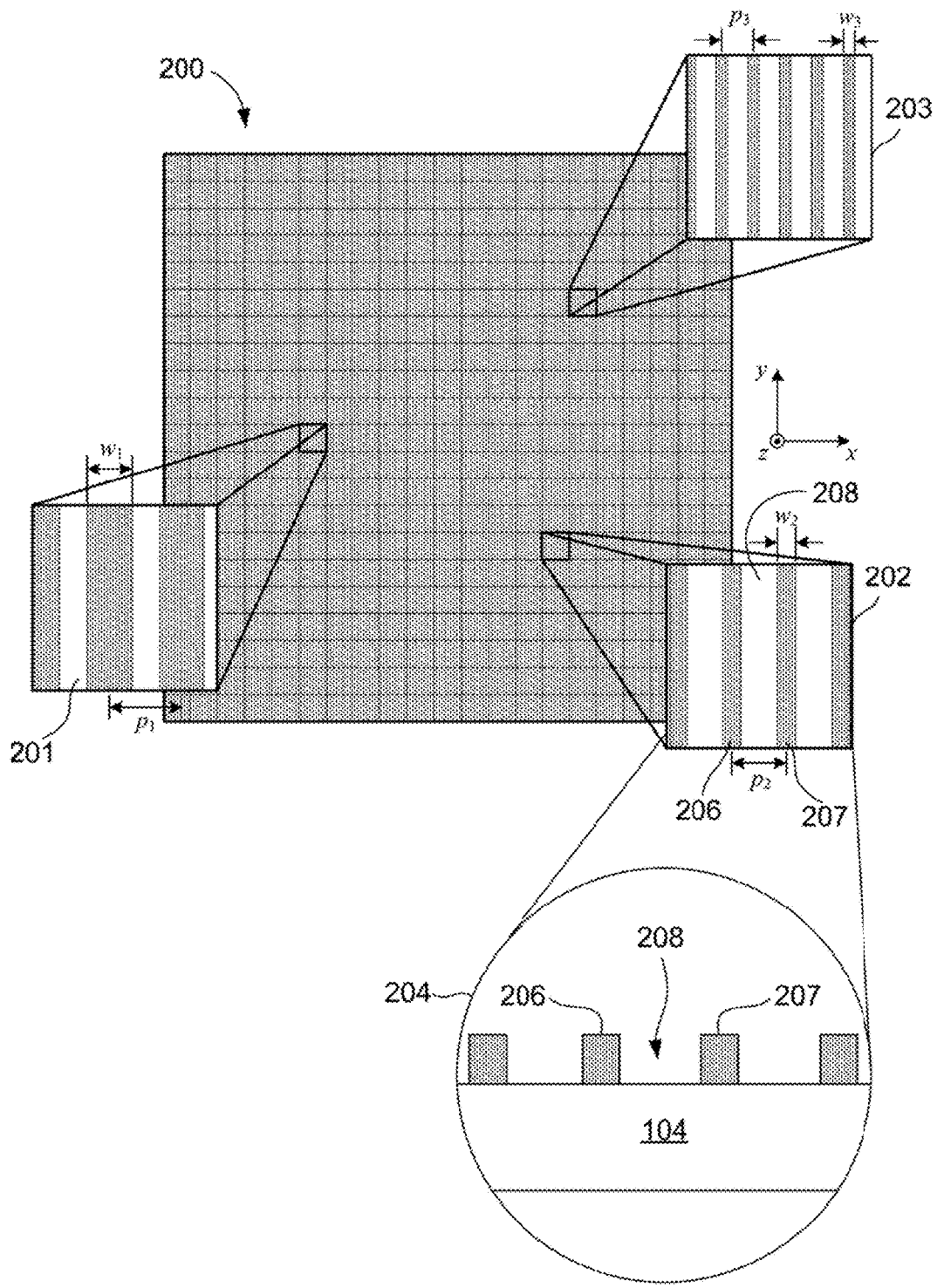
FIG. 2 shows a top plan view of a grating layer of a sub-wavelength grating configured with a one-dimensional grating pattern in accordance with embodiments of the present invention.

Particular reflectance properties of the SWG 100 are determined by the grating pattern selected for the grating layer 102. FIG. 2 shows a top plan view of a grating layer of a SWG 200 configured with a one-dimensional grating pattern in accordance with embodiments of the present invention. The one-dimensional grating pattern is composed of a number of one-dimensional grating sub-patterns. In the example of FIG. 2, three exemplary grating sub-patterns 201-203 are enlarged. Each grating sub-pattern comprises a number of regularly spaced wire-like portions of the grating layer 102 material called "lines" disposed on the surface of the substrate 104. The lines extend in the y-direction and are periodically spaced in the x-direction. FIG. 2 also includes an enlarged end-on view 204 of the grating sub-pattern 202. Shaded rectangles 206 and 207 represent lines composed of a relatively higher index material than the substrate 104. The lines 206 and 207 are separated by a groove 208 extending in the z-direction and exposing the surface of the substrate 104. Each sub-pattern is characterized by a particular periodic spacing of the lines and by the line width in the x-direction. For example, the sub-pattern 201 comprises lines of width $w_1$ separated by a period $p_1$, the sub-pattern 202 comprises lines with width $w_2$ separated by a period $p_2$, and the sub-pattern 203 comprises lines with width $w_3$ separated by a period $p_3$.

The grating sub-patterns 201-203 form sub-wavelength gratings that preferentially reflect incident light polarized in one direction, e.g. the x direction, provided the periods $p_1$, $p_2$, and $p_3$ are smaller than the wavelength of the incident light. For example, the lines widths can range from approximately 10 nm to approximately 300 nm and the periods can range from approximately 20 nm to approximately 1 µm depending on the wavelength of the incident light. The light reflected from a region acquires a phase φ determined by the line thickness t, and the duty cycle η determined by:

$$\eta = \frac{w}{p}$$

where w is the line width and p is the period of the lines associated with the region.

Note the SWG 200 can be configured to reflect the x-polarized component or the y-polarized component of the incident light by adjusting the period, line width and line thickness of the lines. For example, a particular period, line width and line thickness may be suitable for reflecting the x-polarized component but not for reflecting the y-polarized component; and a different period, line width and line thickness may be suitable for reflecting y-polarized component but not for reflecting the x-polarized component.

Figure 3:
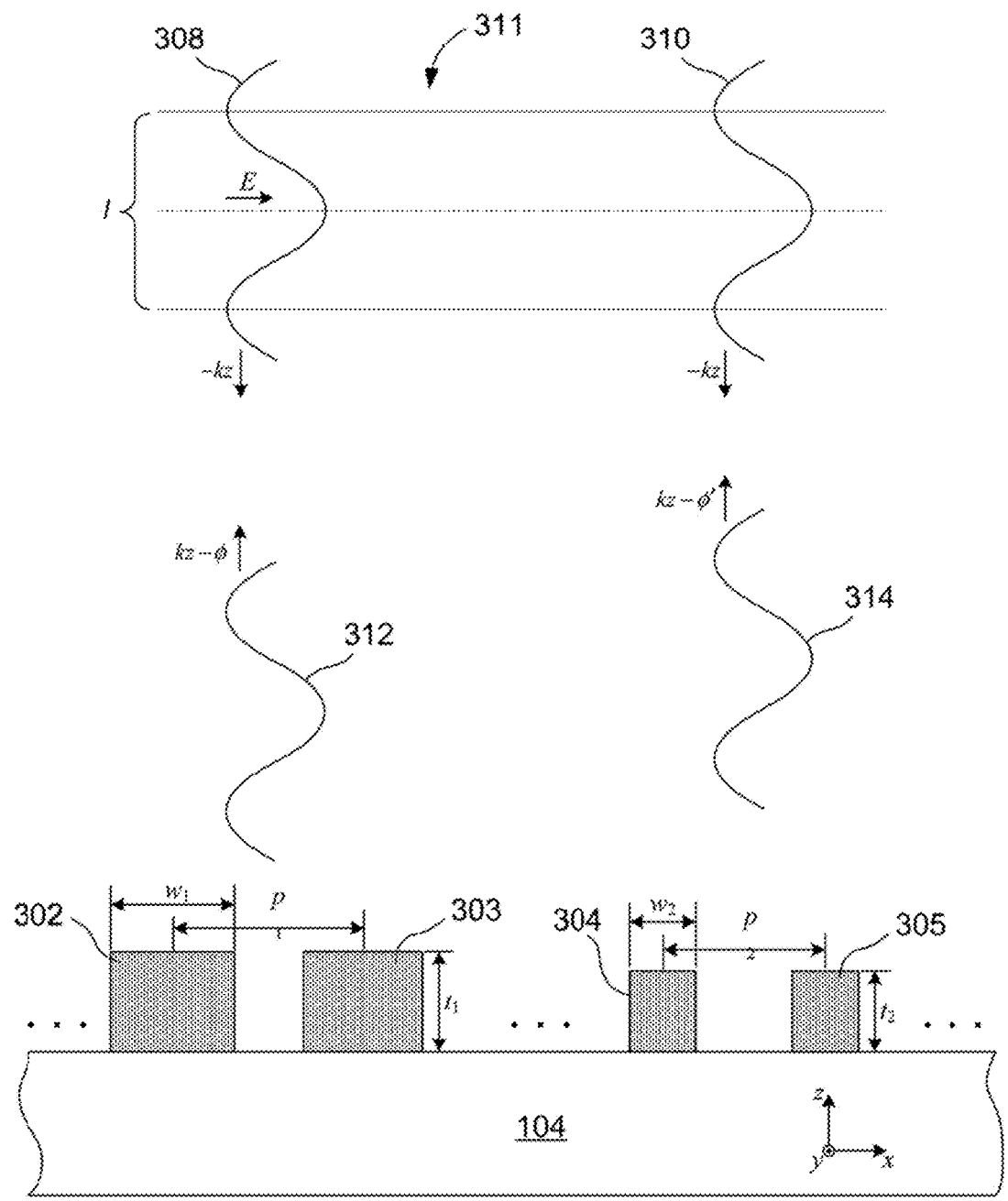
FIG. 3 shows a cross-sectional view of lines from two separate grating sub-patterns revealing the phase acquired by reflected light in accordance with embodiments of the present invention.

Each of the grating sub-patterns 201-203 also reflect incident light polarized in one direction, say the x-direction, differently due to the different duty cycles and periods associated with each of the sub-patterns. FIG. 3 shows a cross-sectional view of lines from two separate grating sub-patterns revealing the phase acquired by reflected light in accordance with embodiments of the present invention. For example, lines 302 and 303 can be lines in a first sub-pattern and lines 304 and 305 can be lines in a second sub-pattern located elsewhere on the substrate 104. The thickness $t_1$ of the lines 302 and 303 is greater than the thickness $t_2$ of the lines 304 and 305, and the duty cycle $\eta_1$ associated with the lines 302 and 303 is also greater than the duty cycle $\eta_2$ associated with the lines 304 and 305. Light polarized in the x-direction and incident on the lines 302-305 becomes trapped by the lines 302 and 303 for a relatively longer period of time than the portion of the incident light trapped by the lines 304 and 305. As a result, the portion of light reflected from the lines 302 and 303 acquires a larger phase shift than the portion of light reflected from the lines 304 and 305. As shown in the example of FIG. 3, the incident waves 308 and 310 strike the lines 302-305 with approximately the same phase, but the wave 312 reflected from the lines 302 and 303 acquires a relatively larger phase shift φ than the phase φ' (φ>φ') acquired by the wave 314 reflected from the lines 304 and 305.

Figure 4:
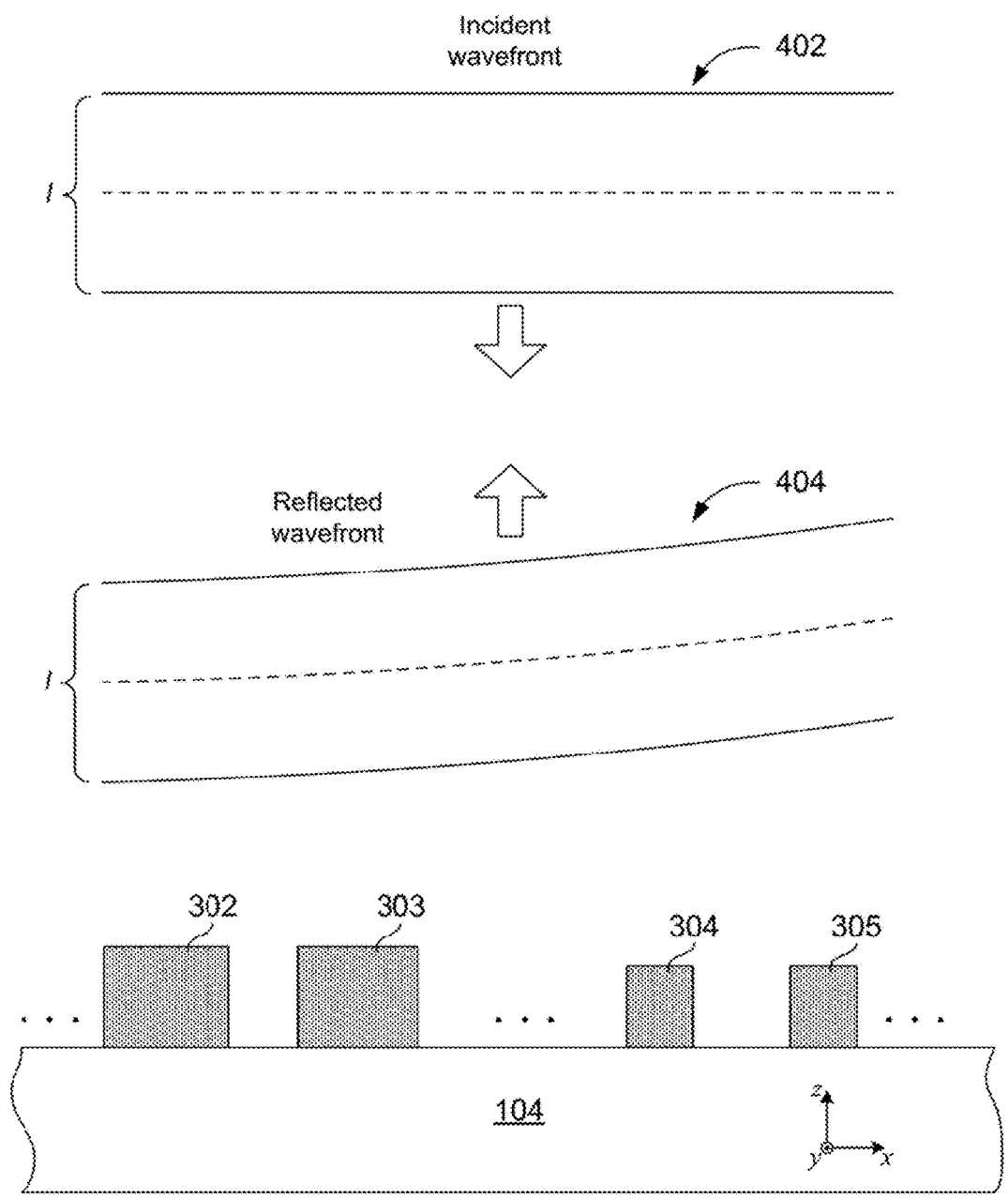
FIG. 4 shows a cross-sectional view of lines from two separate grating sub-patterns revealing how the wavefront changes in accordance with embodiments of the present invention.

FIG. 4 shows a cross-sectional view of the lines 302-305 revealing how the wavefront changes in accordance with embodiments of the present invention. As shown in the example of FIG. 4, incident light with a substantially uniform wavefront 402 strikes the lines 302-305 and the second surface 104 producing reflected light with a curved reflected wavefront 404. The curved reflected wavefront 404 results from portions of the incident wavefront 402 interacting with the lines 302 and 303 with a relatively larger duty cycle $\eta_1$ and thickness $t_1$ than portions of the same incident wavefront 402 interacting with the lines 304 and 305 with a relatively smaller duty cycle $\eta_2$ and thickness $t_2$. The shape of the reflected wavefront 404 is consistent with the larger phase acquired by light striking the lines 302 and 303 relative to the smaller phase acquired by light striking the lines 304 and 305.

The SWGs 200 can be configured to apply a particular phase change to reflected light while maintaining a very high reflectivity. In particular, a SWG configured with a one-dimensional grating pattern can apply a phase change to reflected light polarized perpendicular to the lines, as described above with reference to FIGS. 2-4.

Figure 5:
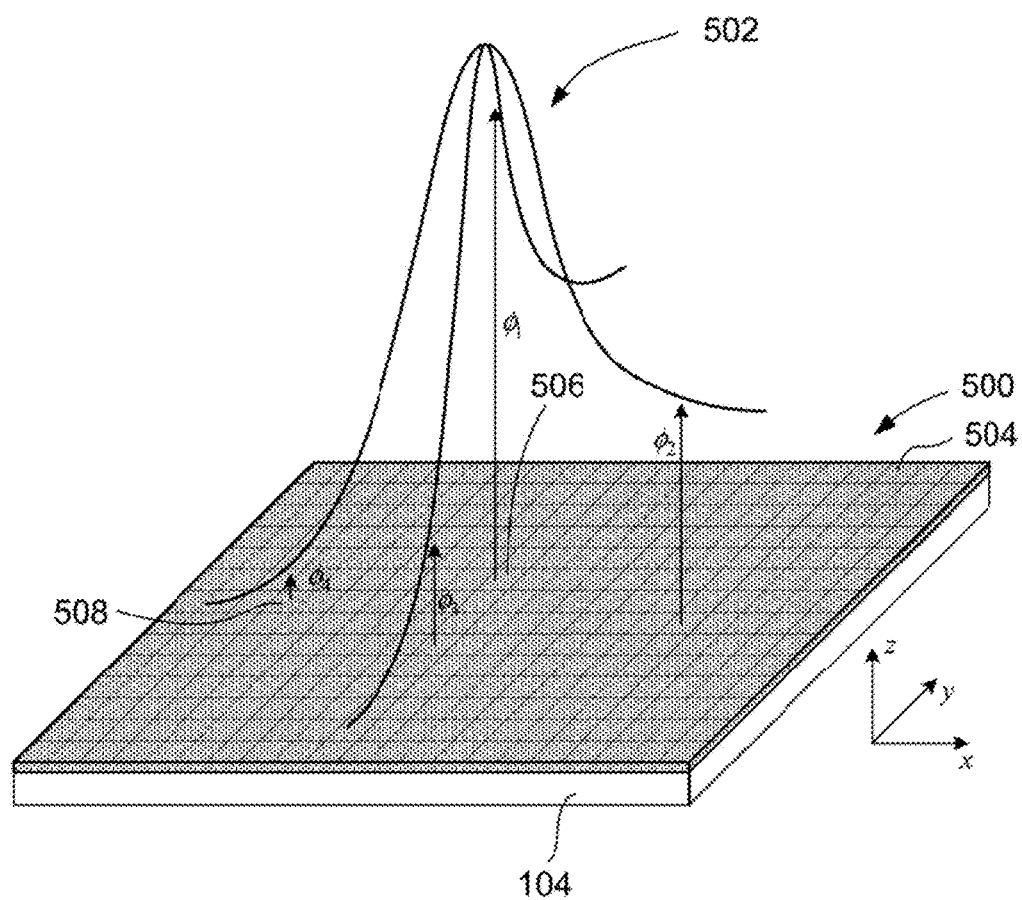
FIG. 5 shows an isometric view of an exemplary phase change contour map produced by a grating pattern configured in accordance with embodiments of the present invention.

FIG. 5 shows an isometric view of an exemplary phase change contour map 502 produced by a particular grating pattern of a grating layer 504 in accordance with embodiments of the present invention. The contour map 502 represents the magnitude of the phase change acquired by light reflected from the SWG 500. In the example shown in FIG. 5, the grating pattern in the grating layer 504 produces a tilted Gaussian-shaped phase contour map 502 with the largest magnitude in the phase acquired by the light reflected near the center of the grating layer 504. The magnitude of the phase acquired by reflected light decreases away from the center of the grating layer 504. For example, light reflected from a sub-pattern 506 acquires a phase of $\phi_1$, and light reflected from a sub-pattern 508 acquires a phase of $\phi_2$. Because $\phi_1$ is much larger than $\phi_2$, the light reflected from the sub-pattern 506 acquires a much larger phase than the light reflected from the sub-pattern 508.

The phase change in turn shapes the wavefront of light reflected from the SWG. For example, as described above with reference to FIG. 3, lines having a relatively larger duty cycle produce a larger phase shift in reflected light than lines having a relatively smaller duty cycle. As a result, a first portion of a wavefront reflected from lines having a first duty cycle lags behind a second portion of the same wavefront reflected from a different set of lines configured with a second relatively smaller duty cycle. Embodiments of the present invention include patterning the grating layer of a SWG to control the phase change and ultimately the reflected wavefront so that the SWG can be operated as an optical device with particular optical properties, such as a focusing mirror or a diverging mirror.

Figure 6A:
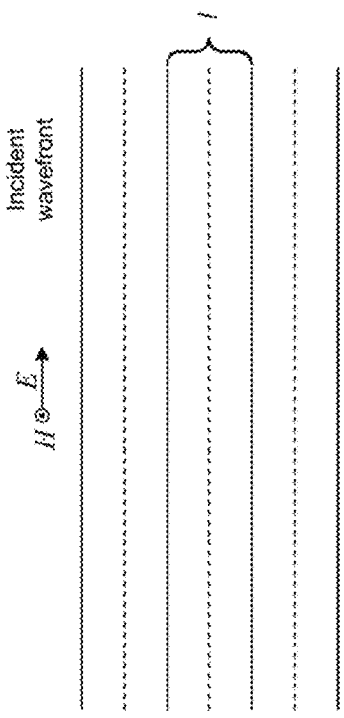
FIG. 6A shows a side view of a sub-wavelength grating configured to focus incident light to a focal point in accordance with embodiments of the present invention.
Figure 6A:
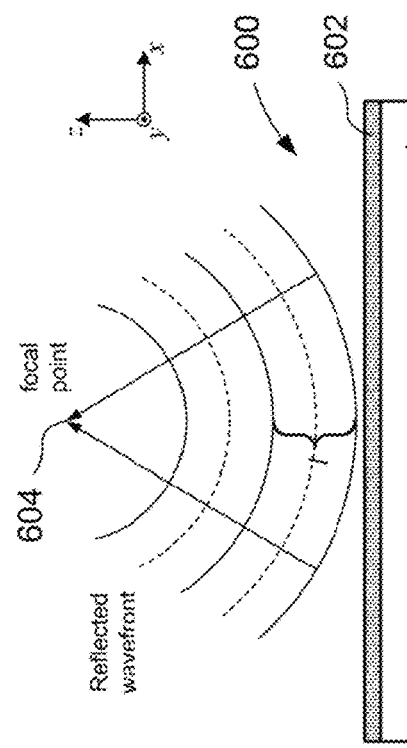
Figure 6B:
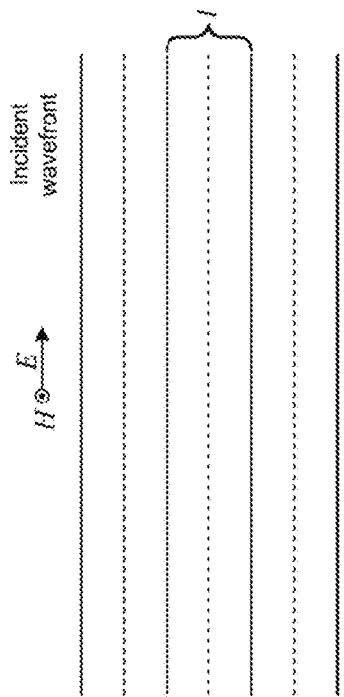
FIG. 6B shows a side view of a sub-wavelength grating configured and operated as a diverging mirror in accordance with embodiments of the present invention.
Figure 6B:
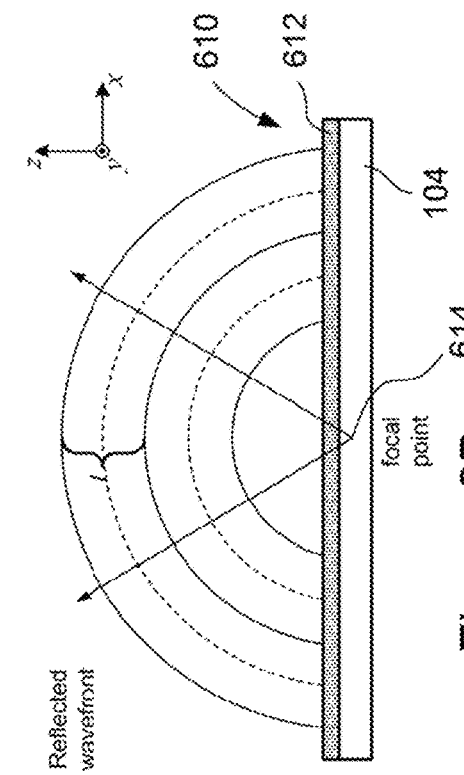

FIG. 6A shows a side view of a SWG 600 with a grating layer 602 configured to focus incident light to a focal point 604 in accordance with embodiments of the present invention. In the example of FIG. 6A, the grating layer 602 is configured with a grating pattern so that incident light polarized in the x-direction is reflected with a wavefront corresponding to focusing the reflected light at the focal point 604. On the other hand, FIG. 6B shows a side view of a SWG 610 configured and operated as a diverging mirror in accordance with embodiments of the present invention. In the example of FIG. 6B, the grating layer 612 is configured with a grating pattern so that incident light polarized in the x-direction is reflected with a wavefront corresponding to light emanating from a focal point 614. Embodiments directed to focusing and diverging light are described in greater detail below in a subsection titled Cylindrical and Spherical Mirrors.

II. Designing Sub-Wavelength Gratings

Figure 7:
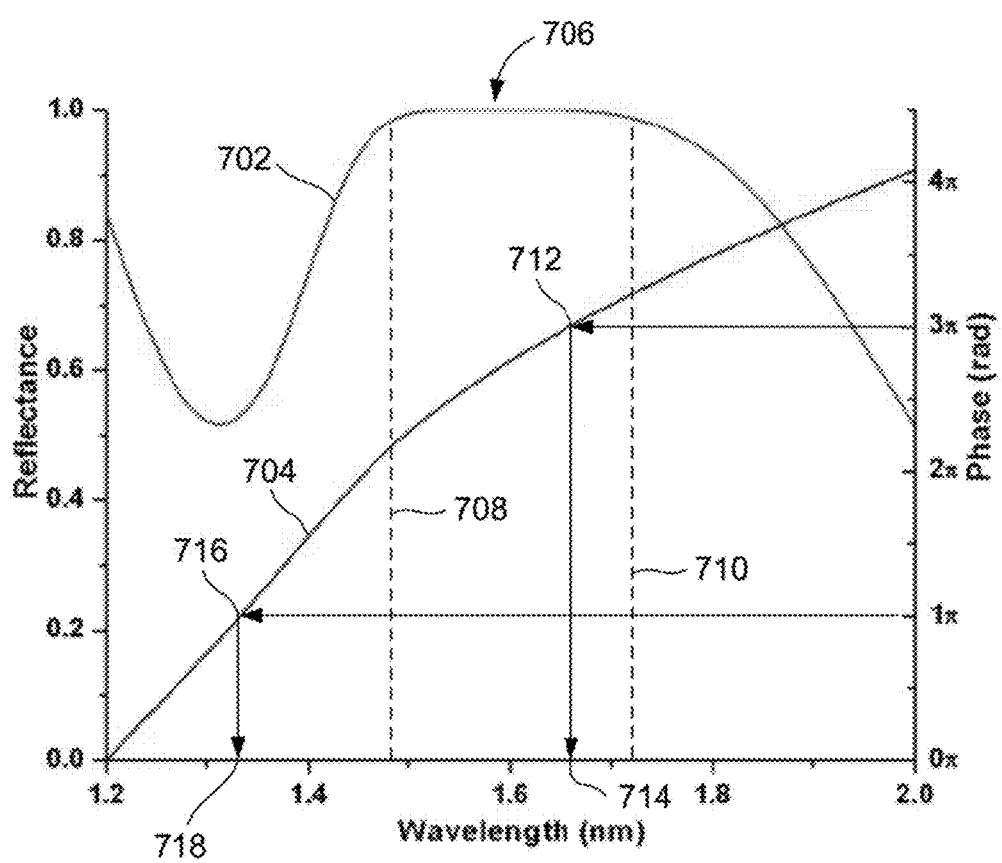
FIG. 7 shows a plot of reflectance and phase shift over a range of incident light wavelengths for a sub-wavelength grating configured in accordance with embodiments of the present invention.

Embodiments of the present invention include a number of ways in which a SWG can be designed to operate as a mirror that introduces a desired phase front to the reflected light. An example of a SWG designed to produce a particular phase change in reflected light is described above in FIG. 5. A first method includes determining a reflection coefficient profile for the grating layer of a SWG. The reflection coefficient is a complex valued function represented by:

$$r(\lambda) = \sqrt{R(\lambda)} e^{i\phi(\lambda)}$$

where $R(\lambda)$ is the reflectance of the SWG, and $\phi(\lambda)$ is the phase shift or change produced by the SWG. FIG. 7 shows a plot of reflectance and phase shift over a range of incident light wavelengths for a SWG comprising a Si grating layer disposed on a quartz substrate in accordance with embodiments of the present invention. In this example, the grating layer is configured with a one-dimensional grating and is operated at normal incidence with the electric field polarized perpendicular to the lines comprising the grating layer. In FIG. 7, curve 702 corresponds to the reflectance $R(\lambda)$ and curve 704 corresponds to the phase shift $\phi(\lambda)$ produced by the SWG for the incident light over the wavelength range of approximately 1.2 µm to approximately 2.0 µm. The reflectance and phase curves 702 and 704 can be determined using either the well-known finite element method or rigorous coupled wave analysis. Due to the strong refractive index contrast between Si and air, the grating has a broad spectral region of high reflectivity 706. However, curve 704 reveals that the phase of the reflected light varies across the entire high-reflectivity spectral region between dashed-lines 708 and 710.

When the spatial dimensions of the period and width of the lines is changed uniformly by a factor $\alpha$, the reflection coefficient profile remains substantially unchanged, but with the wavelength axis scaled by the factor $\alpha$. In other words, when a grating has been designed with a particular reflection coefficient $R_0$ at a free space wavelength $\lambda_0$, a new grating with the same reflection coefficient at a different wavelength $\lambda$ can be designed by multiplying all the grating geometric parameters, such as the period, line thickness, and line width, by the factor $\alpha = \lambda/\lambda_0$, giving $r(\lambda) = r_0(\lambda/\alpha) = r_0(\lambda_0)$.

In addition, a grating can be designed with $|R(\lambda)| \to 1$, but with a spatially varying phase, by scaling the parameters of the original periodic grating non-uniformly within the high-reflectivity spectral window 706. Suppose that introducing a phase $\phi(x,y)$ on a portion of light reflected from a point on the SWG with transverse coordinates (x,y) is desired. Near the point (x,y), a nonuniform grating with a slowly varying grating scale factor $\alpha(x,y)$ behaves locally as though the grating was a periodic grating with a reflection coefficient $R_0(\lambda/\alpha)$. Thus, given a periodic grating design with a phase $\phi_0$ at some wavelength $\lambda_0$, choosing a local scale factor $\alpha(x,y) = \lambda/\lambda_0$ gives $\phi(x,y) = \phi_0$ at the operating wavelength $\lambda$. For example, suppose that introducing a phase of approximately $3\pi$ on a portion of the light reflected from a point (x,y) on a SWG design is desired, but the line width and period selected for the point (x,y) introduces a phase of approximately $\pi$. Referring now to the plot of FIG. 7, the desired phase $\phi_0 = 3\pi$ corresponds to the point 712 on the curve 704 and the wavelength $\lambda_0 \approx 1.67$ µm 714, and the phase 7 associated with the point (x,y) corresponds to the point 716 on the curve 704 and the wavelength $\lambda = 1.34$ µm. Thus the scale factor is $\alpha(x,y) = \lambda/\lambda_0 = 1.34/1.67 = 0.802$, and the line width and period at the point (x,y) can be adjusted by multiplying by the factor $\alpha$ in order to obtain the desired phase $\phi_0 = 3\pi$ at the operating wavelength $\lambda = 1.34$ µm.

Figure 8:
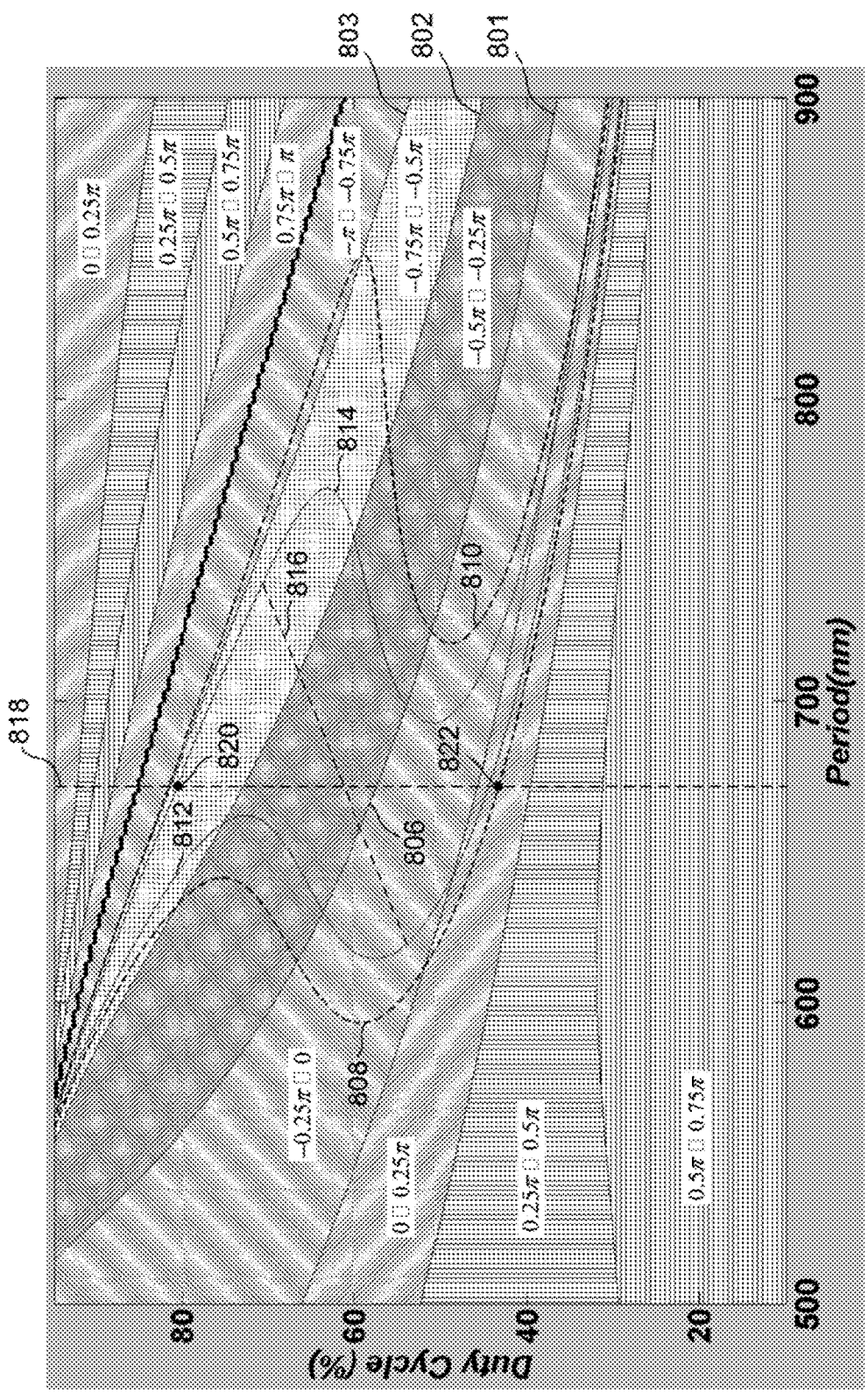
FIG. 8 shows a phase contour plot of phase variation as a function of period and duty cycle obtained in accordance with embodiments of the present invention.

The plot of reflectance and phase shift versus a range of wavelengths shown in FIG. 7 represents one way in which parameters of a SWG, such as line width, line thickness and period, can be determined in order to introduce a particular phase to light reflected from a particular point of the SWG. In other embodiments, phase variation as a function of period and duty cycle can also be used to construct a SWG. FIG. 8 shows a phase contour plot of phase variation as a function of period and duty cycle obtained in accordance with embodiments of the present invention using either the well-known finite element method or rigorous coupled wave analysis. Contour lines, such as contour lines 801-803, each correspond to a particular phase acquired by light reflected from a grating pattern with a period and duty cycle lying anywhere along the contour. The phase contours are separated by $0.25\pi$ rad. For example, contour 801 corresponds periods and duty cycles that apply a phase of $-0.25\pi$ rad to reflected light, and contour 802 corresponds to periods and duty cycles that apply a phase of $-0.5\pi$ rad to reflected light. Phases between $-0.25\pi$ rad and $-0.5\pi$ rad are applied to light reflected from an SWG with periods and duty cycles that lie between contours 801 and 802. A first point $(p,\eta)$ 804, corresponding to a grating period of 700 nm and 54% duty cycle, and a second point $(p,\eta)$ 806, corresponding to a grating period of 660 nm and 60% duty cycle, both of which lie along the contour 801. A grating pattern with a period and duty cycle represented by the first point 804 introduces the same phase $\phi=-0.25\pi$ rad to reflected light as a grating pattern represented by the second point 806.

FIG. 8 also includes two reflectivity contours for 95% and 98% reflectivity overlain on the phase contour surface. Dashed-line contours 808 and 810 correspond to 95% reflectivity, and solid line contours 812 and 814 correspond to 98% reflectivity. Points $(p,\eta,\phi)$ that lie anywhere between the contours 808 and 810 have a minimum reflectivity of 95%, and points $(p,\eta,\phi)$ that lie anywhere between the contours 812 and 814 have a minimum reflectivity of 98%.

The points $(p,\eta,\phi)$ represented by the phase contour plot can be used to select periods and duty cycles for a grating that can be operated as a particular type of mirror with a minimum reflectivity, as described below in the next subsection. In other words, the data represented in the phase contour plot of FIG. 8 can be used to design SWG optical devices. In certain embodiments, the period or duty cycle can be fixed while the other parameter is varied to design and fabricate SWGs. In other embodiments, both the period and duty cycle can be varied to design and fabricate SWGs.

III. Methods for Fabricating Sub-Wavelength Dielectric Gratings

Embodiments of the present invention include a general method for designing a grating to operate as a lens where the period and the duty cycle can vary by selecting a continuous phase distribution oriented in any suitable direction inside a selected reflectivity region of the phase contour surface shown in FIG. 8. For example, dashed line 816 represents a selected phase distribution $\phi$ for a SWG mirror overlain on the phase contour surface within the region of 98% minimum reflectivity. The variable period and duty cycle can determined as follows:

Consider a selected target phase distribution $\phi=\Psi(x)$ along a continuous curve inside a desired reflectivity region of the phase contour surface, such as the curve represented by line 816 of FIG. 8. The line representing the phase distribution $\phi=\Psi(x)$ can also be described as a one-dimensional parametric function $\phi=\Phi(t)$ with corresponding parametric functions of the parameter t representing the period $p=P(t)$ and duty cycle $\eta=H(t)$. In other words, any point on the target phase distribution $\phi=\Psi(x)$ can be related to a parameter t and a corresponding phase described by $\phi=\Phi(t)$, while the corresponding period and duty cycle are represented by the linear functions $p=P(t)$ and $\eta=H(t)$. For example, $\Phi(t)$ can be determined by matching $\phi=\Psi(x)$ to points along a curve of the phase contour surface between desired minimum reflectivity contours, such as the curve represented by line 816 in FIG. 8. Projecting the curve onto the $p\eta$-plane produces a line that can be characterized by parametric equations $P(t)$ and $H(t)$. The phase at the center of the lens is determined by $\phi_0=\Psi(x_0=0)$. By solving $\Phi(t)=\Psi(x=0)$ for the value of $t=t_0$. The period and duty cycle for the line centered at position $x=0$ are $p_0=P(t_0)$ and $\eta_0=H(t_0)$. The center of the lens and duty cycles are found one-by-one following an iteration process described as follows:

Suppose the center position for period number n is $x_n$ with period value $p_n$. The center position of the next period can be determined by:

$$x_{n+1} = x_n + \frac{p_n}{2} + \frac{p_{n+1}}{2} \qquad \text{Equation (1)}$$

where $x_n$ and $p_n$ are known values and $p_{n+1}$ is to be determined. The phase at position $x_{n+1}$ can be determined by the line $\Phi(t)$ at $t=t_{n+1}$, where $t_{n+1}$ is also a value to be determined. The phase at $x_{n+1}$ also satisfies the selected phase distribution $\Psi(x)$. Thus $$\Psi(x_{n+1})=\Phi(t_{n+1}) \qquad \text{Equation (2):}$$

and $$p_{n+1}=P(t_{n+1}) \qquad \text{Equation (3)}$$

Inserting Equations (1) and (3) into Equation (2) gives:

$$\Psi\left(x_n + \frac{p_n}{2} + \frac{p_{n+1}}{2}\right) = \Phi(t_{n+1}) \qquad \text{Equation (4)}$$

Equation (4) is a function of only one unknown $t_{n+1}$, which can be solved numerically. After finding $t_{n+1}$, $p_{n+1}$ is found by equation (3) and $x_{n+1}$ is found by equation (1), while the duty cycle is calculated from $\eta_{n+1}=H(t_{n+1})$. The former iteration process is repeated until $x_n \geq A$ where A is the specified lens radius. Although it may be possible that for some give continuous lines $(\Phi(t), P(t), H(t))$, a solution for equation (4) may not exist. In practice, such situations should be rare.

Figure 9:
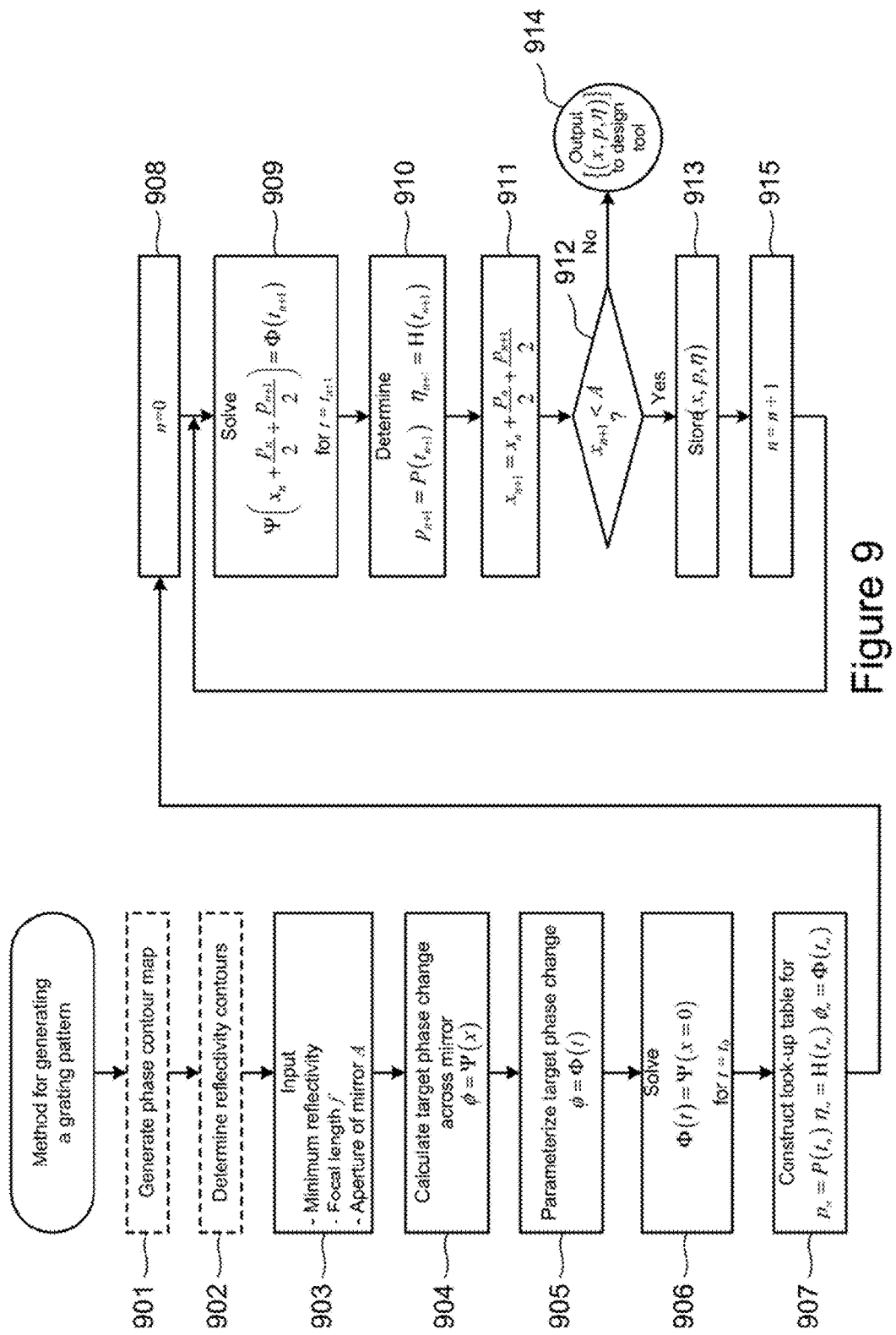
FIG. 9 shows control-flow diagram for generating a grating pattern where the period and duty cycle are allowed to vary in accordance with embodiments of the present invention.

FIG. 9 shows a control-flow diagram for generating a grating pattern where the period and duty cycle are allowed to vary in accordance with embodiments of the present invention. In step 901, a phase contour map, represented by the phase contour plot shown in FIG. 8, is calculated to determine, in general, a data set $\{(p,\eta,\phi)\}$ representing the relationship between phase, duty cycle and period of any SWG optical device. In step 902, reflectivity contours are determined for the phase contour map, such as the reflectivity contours 808 and 810 for the 95% reflectivity, shown in FIG. 8. The phase contour map $\{(p,\eta,\phi)\}$ and the reflectivity contour data can be stored in and retrieved from a computer-readable medium, as described in greater detail below with reference to FIG. 16. Note that steps 901 and 902 can be performed one time and the data generated by steps 901 and 902 can be used in the execution of steps 903-913 to determine focusing and non-focusing SWG mirrors, or used to generate a grating pattern for any other SWG optical device. In step 903, the minimum reflectivity, focal length, mirror radius A can be input as described above. In step 904, a selected target phase change across the mirror $\phi=\Psi(x)$ can be determined as described below with reference to FIGS. 11 and 15. In step 905, the target phase $\phi=\Psi(x)$ is matched to a continuous curve of the phase contour surface within a desired reflectivity region, such as the curve represented by line 816 of FIG. 8 for minimum 98% reflectivity. The target phase $\phi=\Psi(x)$ is parameterized to obtain a one-dimensional parametric function $\phi=\Phi(t)$. In step 906, the phase at the center of the lens is determined by $\phi_0=\Psi(x_0=0)$. By solving $\Phi(t)=\Psi(x=0)$ for the value of $t=t_0$, the period and duty cycle for the line centered at position $x_0=0$ are given by $p_0=P(t_0)$ and $\eta_0=H(t_0)$. In step 907, a look-up table for the period $p_n=P(t_n)$, duty cycle $\eta_n=H(t_n)$, and phase $\phi_n=\Phi(t_n)$ as a function of the parameter $t_n$ is constrained. In step 908, the period number n is initialized to zero. In step 909, equation (3):

$$\Psi\left(x_n + \frac{p_n}{2} + \frac{P(t_{n+1})}{2}\right) = \Phi(t_{n+1})$$

is solved for $t_{n+1}$ numerically using Newton's method or another suitable numerical method for determining $t_{n+1}$. In step 910, given $t_{n+1}$, the period $p_n=P(t_n)$ and duty cycle $\eta_n=H(t_n)$ can be determined from the look-up table. In step 911, the center position of the next period can be determined by:

$$x_{n+1} = x_n + \frac{p_n}{2} + \frac{p_{n+1}}{2}$$

In step 912, when $x_{n+1}$ is less than A, proceed to step 913 where the three-tuple $(x_n,p_n,\eta_n)$ can be stored in a computer readable medium as described below. In step 914, the stored values $(x_n,p_n,\eta_n)$ can be sent to a design tool where a SWG with the input parameters can be fabricated. In step 915, the period number is incremented.

Figure 10A:
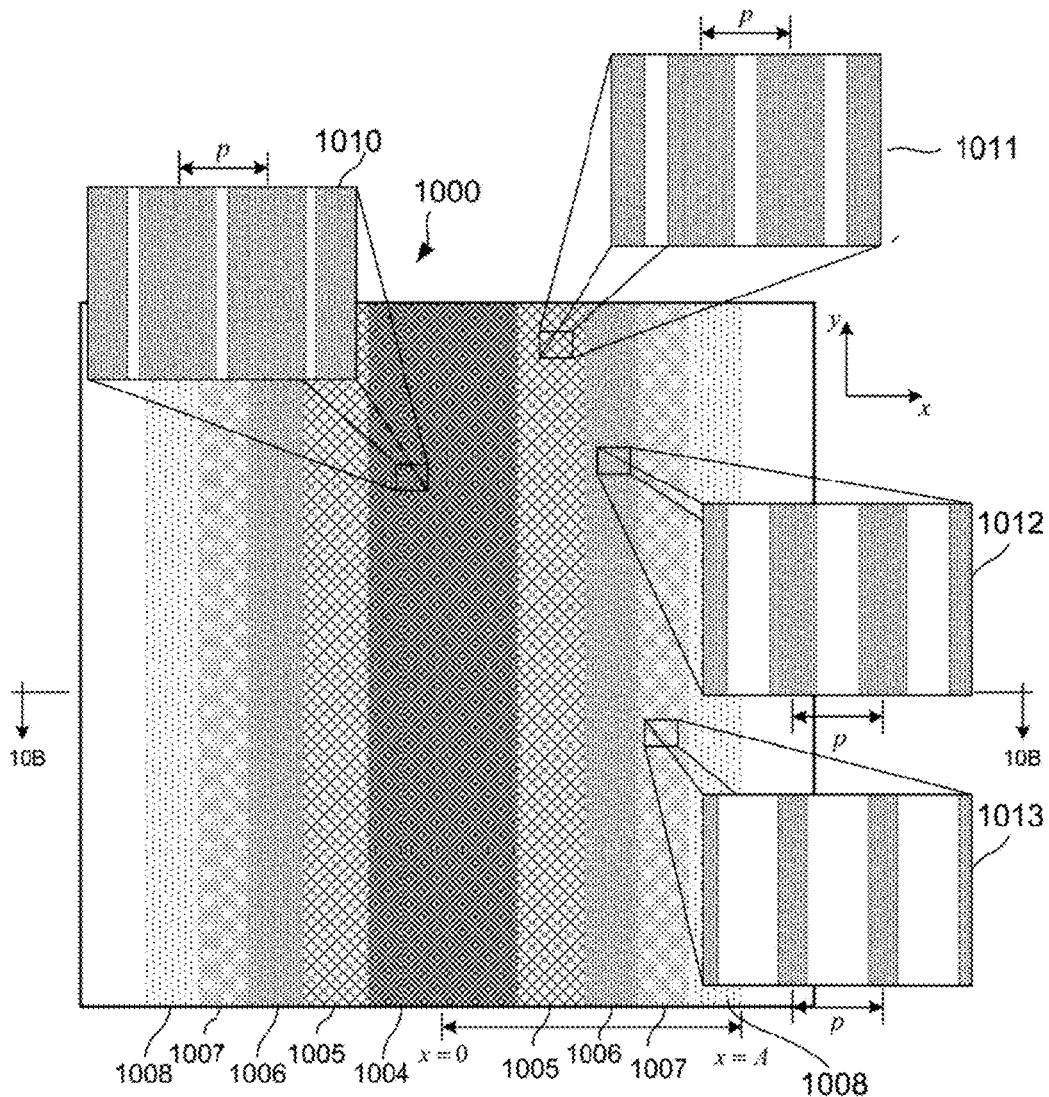
FIG. 10A shows a top plan-view of a one-dimensional sub-wavelength grating configured to operate as a focusing cylindrical mirror in accordance with embodiments of the present invention.
Figure 10B:
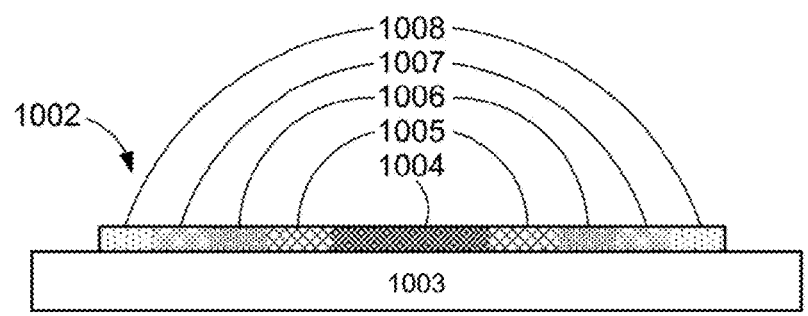
FIG. 10B shows a cross-sectional view of the sub-wavelength grating along a line 10B-10B, shown in FIG. 10A, in accordance with embodiments of the present invention.

Now consider configuring a simple substantially planar SWG to operate as a cylindrical mirror. The SWG has a variable line width, or duty cycle, but the period is constant throughout. FIG. 10A shows a top plan-view of a one-dimensional SWG 1000 configured to operate as a focusing cylindrical mirror for incident light polarized parallel to the x-direction in accordance with embodiments of the present invention. FIG. 10B shows a cross-sectional view of the SWG 1000 along a line 10B-10B, shown in FIG. 10A, in accordance with embodiments of the present invention. As shown in FIG. 10B, the SWG 1000 comprises a grating layer 1002 disposed on a surface of a substrate 1003. The grating layer 1002 can be composed a material having a relatively higher refractive index than the substrate 1003. The grating layer 1002 defines a mirror aperture extending the length of the SWG 1000 in the y-direction and having a length 2A in the x-direction. FIGS. 10A-10B include shaded regions 1004-1008 of the grating layer 1002. Each shaded region represents a different grating sub-pattern of lines formed in the grating layer 1002, with darker shaded regions, such as region 1004, representing regions with a relatively larger duty cycle than lighter shaded regions, such as region 1007. FIG. 10A also includes enlargements 1010-1013 of sub-regions of the four regions 1004-1007 revealing that the lines run parallel in the y-direction and the line period p is constant or fixed in the x-direction. Enlargements 1010-1013 also reveal that the line width w, in other words the duty cycle η, decreases away from the center. The grating layer 1002 is configured to focus reflected light polarized in the x-direction to a focal point, as described above with reference to FIG. 6A.

Prior to fabricating the SWG cylindrical mirror 1000 shown in FIG. 10, a minimum reflectivity, focal length f, mirror aperture 2A, and preferred period range $p_{min}$ and $p_{max}$ are determined. The minimum reflectivity, focal length f, and mirror aperture 2A are constraints that may be determined by the user, based on how the SWG mirror 1000 is intended to be used or the type of device the SWG mirror 1000 is intended to be used in. For example, a user may want to employ the SWG mirror 1000 in a system with a preferred focal length of 15 mm and with a minimum reflectivity of 85%. In addition, the aperture may not exceed 10 mm. The preferred period range may be constrained by resolution limitations in the techniques used to fabricate the SWG mirror 1000.

Figure 11:
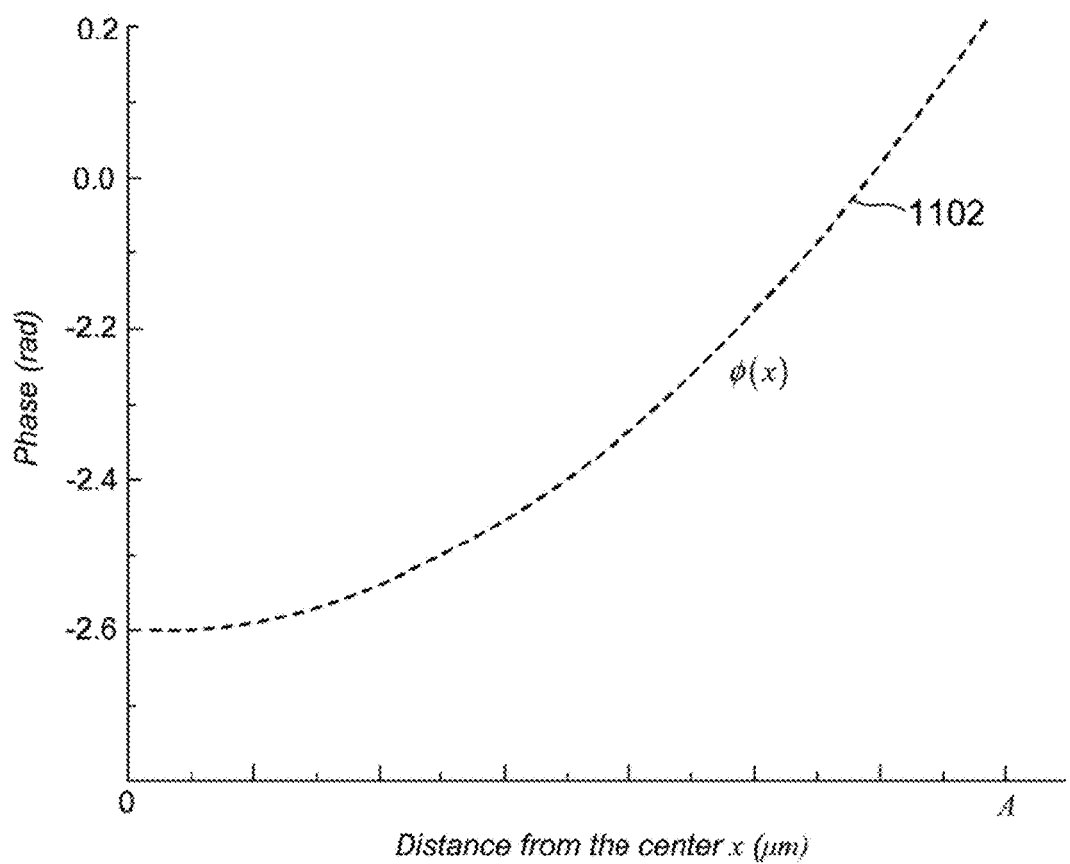
FIG. 11 shows an exemplary plot of the target phase change for a cylindrical mirror determined in accordance with embodiments of the present invention.

Once the parameters for the SWG mirror have been determined, a desired or target phase change across the mirror in the x-direction can be determined. For a cylindrical focusing mirror, the target phase change across the SWG mirror can be determined according to the expression:

$$\phi(x) = \phi_0 + \frac{2\pi}{\lambda R_M}x^2$$

where $\phi_0$ is the largest phase shift, $R_M$ is the spherical radius or curvature of the mirror (i.e., $R_M=2f$), and x represents the distance from the center of the mirror, as shown in FIG. 10, with the constraint $0 \leq x \leq A$. FIG. 11 shows an exemplary plot of the target phase $\phi(x)$ for a cylindrical mirror determined in accordance with embodiments of the present invention. In FIG. 11, curve 1102 corresponds to the target phase $\phi(x)$ over the distance from the center of the mirror x=0 to the edge of the aperture x=A with $\phi_0=-2.6$. In other words, the target phase $\phi(x)$ 1102 represents a desired phase change acquired by light polarized in the x-direction and reflected from the SWG mirror between x=0 and x=A.

The target phase change $\phi(x)$ shown in FIG. 11 and the phase contour information represented in FIG. 8 can be used in combination to determine an appropriate fixed period and duty cycles in the x-direction of the SWG mirror 1000. For example, suppose the minimum reflectivity required is 98%. For the fixed period SWG mirror 1000, the optimum period can be determined by matching points of the target phase $\phi(x)$ 1002, shown in FIG. 10, with points of the phase contour surface of FIG. 10, with the constraints that the period lies between $p_{min}$ and $p_{max}$, and the points x=0 and x=A μm intersect the 98% reflectance contours 814 and 812, respectively. This is equivalent to the conceptual operation of overlaying the phase $\phi(x)$ 1102 on the contour surface of FIG. 10 with the target phase $\phi(x)$ 1102 directed perpendicular to the period axis, between $p_{min}$ and $p_{max}$, such that x=0 and x=A μm intersect the reflectance contours 1014 and 1012, respectively, and the values of the target phase $\phi(x)$ 1102 substantially correspond to values of the phase contour surface. Referring now to the contour plot shown in FIG. 8, line 818 between points 820 and 822 corresponds to the phase $\phi(x)$ 1102 substantially matching phase values of the phase contour surface between $p_{min}$ and $p_{max}$. The point 822 on the 98% reflectivity contour 812 corresponds to the phase $\phi(A)$, and the point 820 on the 98% reflectivity contour 814 corresponds to the phase $\phi(0)$. The line 818 intersects the period axis at 670 nm, which corresponds to the optimum fixed period. The duty cycles associated with the regions of the SWG mirror 1000 along the x-direction can now be determined by reading the duty cycle values between the points 820 and 822.

Figure 12:
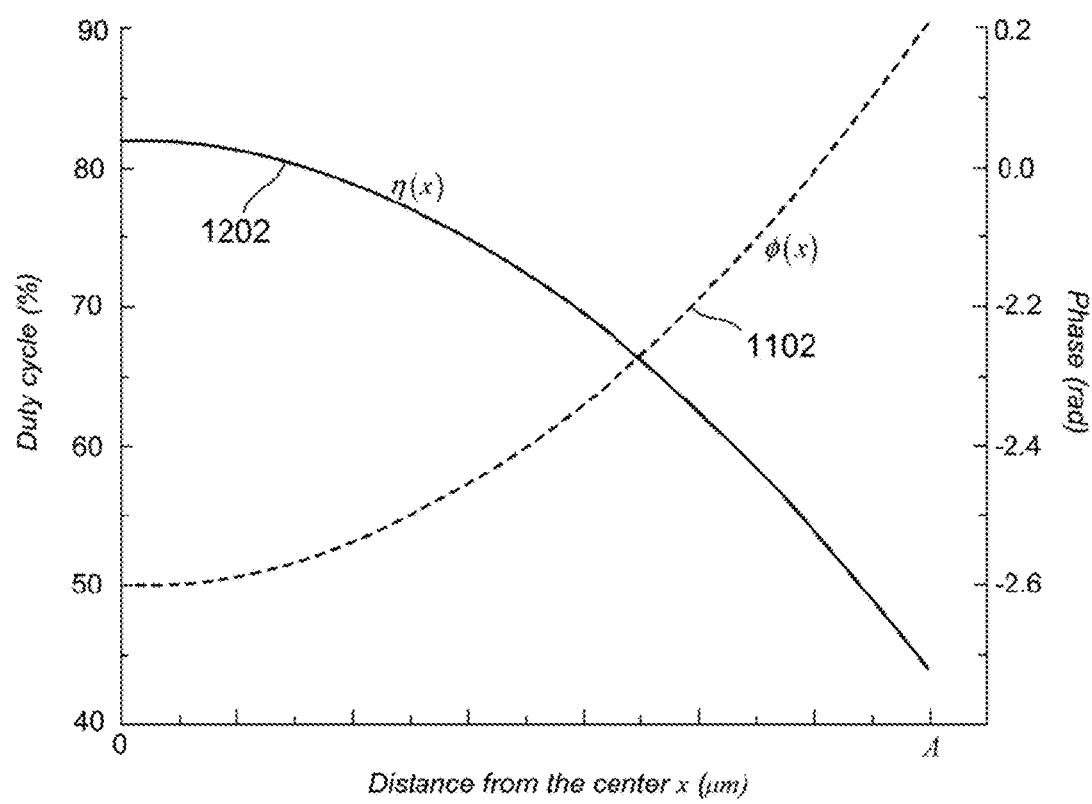
FIG. 12 shows a plot of a duty cycle in accordance with embodiments of the present invention.

FIG. 12 shows a plot of the duty cycle as a function of the x-coordinate between x=0 and x=A in accordance with embodiments of the present invention. Curve 1202 represents the duty cycle η(x) determined by overlaying the target phase ϕ(x) 1102 on the phase contour surface and reading off the corresponding duty cycle from the duty cycle axis between the points 820 and 822 of FIG. 8. The duty cycle η(x) 1202 can be used to determine the duty cycle for points along the x-direction of the SWG mirror 1000. The x-coordinates as a function of the period p, phase change, duty cycle, and line width (i.e., w=ηp) for the hypothetical target phase ϕ(x) 1102 are presented in a look-up table:

TABLE I

| x | ϕ (radians) | η (%) | w (μm) |
|---|---|---|---|
| 0 | −2.6 | 82 | 0.122 |
| p | −2.3 | 77.8 | 0.116 |
| 2p | −2.0 | 73.6 | 0.110 |
| 3p | −1.7 | 69.4 | 0.104 |
| 4p | −1.4 | 65.2 | 0.097 |
| 5p | −1.1 | 61.0 | 0.091 |
| 6p | −0.8 | 56.8 | 0.085 |
| 7p | −0.5 | 52.4 | 0.078 |
| 8p | −0.2 | 48.2 | 0.072 |
| A | 0.1 | 44 | 0.066 |

The example results presented in look-up Table I can be used to fabricate a SWG cylindrical mirror by providing the x coordinates, period, and line width as input to a lithographic micro-chip processing tool, such as a processing tool for fabricating standard CMOS device. For example, an SWG cylindrical mirror can be fabricated in 450 nm thick amorphous Si deposited on a quartz substrate at approximately 300° C. using plasma-enhanced chemical vapor deposition. The grating pattern can be defined using electron beam lithography with a commercial hydrogen silsequioxane negative resist, FOX-12®, exposed at 200 μC/cm² and developed for 3 minutes in a solution of MIF 300 developer. After development, the grating patterns can be descummed using $CH_4/H_2$ reactive ion etching to clear the resist residue from the grooves between the grating lines. The Si lines can be formed by dry etching with $HBr/O_2$ chemistry. At the end of the process, a 100 nm thick resist layer may remain on top of the Si lines, which was included in the numerical simulation results described below. The grating can also be fabricated using photolithography, nano-imprint lithography, or e-beam lithography with a positive tone resist.

Figure 13:
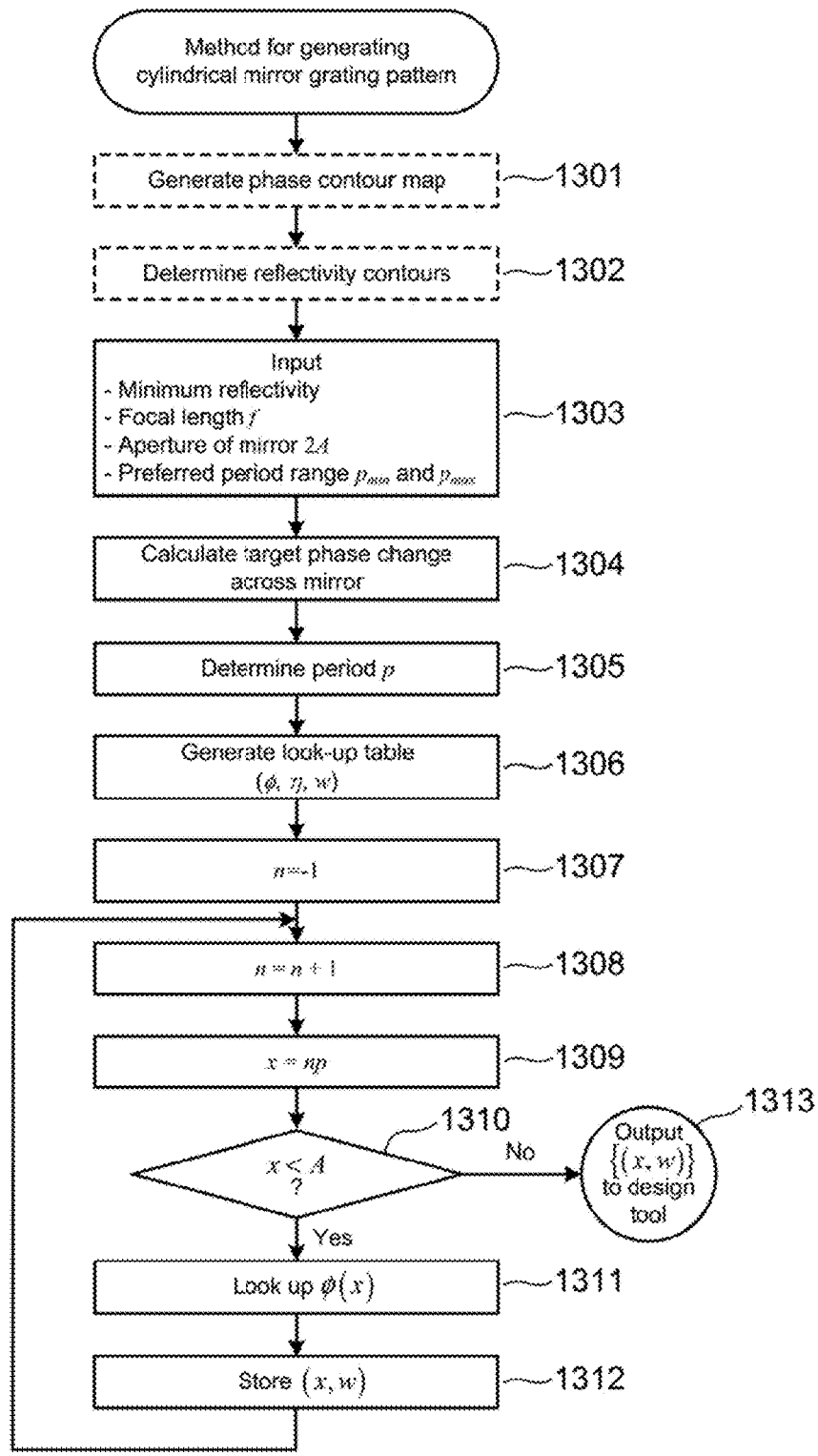
FIG. 13 shows a control-flow diagram of a method for generating a grating pattern for a focusing sub-wavelength grating cylindrical mirror in accordance with embodiments of the present invention.

FIG. 13 shows a control-flow diagram of a method for generating a grating pattern with a fixed period for a focusing SWG cylindrical mirror in accordance with embodiments of the present invention. Steps 1301 and 1302 are identical to the steps 901 and 902 of FIG. 9, as described above. In step 1303, the desired minimum reflectivity, focal length, aperture of the mirror 2A, and the preferred period range are input, as described above with reference to FIG. 10. In step 1304, the target phase change across the mirror along the x-direction is calculated as described above with reference to FIG. 11. In step 1305, the period p can be determined by matching the target phase change with a portion of the phase contour map with the constraints imposed by the minimum reflectivity and period range, as described above with reference to FIG. 8. In step 1306, a look-up table representing the relationship between phase and the line width is determined as described above with reference to FIG. 12 and Table I. In step 1307, the period number n is initialized to the integer value −1. In step 1308, the period number is incremented. In step 1309, the x-coordinate is determined by x=np. In step 1310, when x is less than A, the method proceeds to step 1311. Otherwise the method proceeds to step 1313. In step 1311, for the x determined in step 1309, the corresponding phase is determined from the look-up table determined in step 1306. In step 1312, the x-coordinate and line width is stored as a data set {(x,w)} in a computer-readable medium. In step 1313, the data set is provided to a design tool for fabricating a SWG cylindrical mirror with the target phase change determined in step 1304, as described above.

Figure 14:
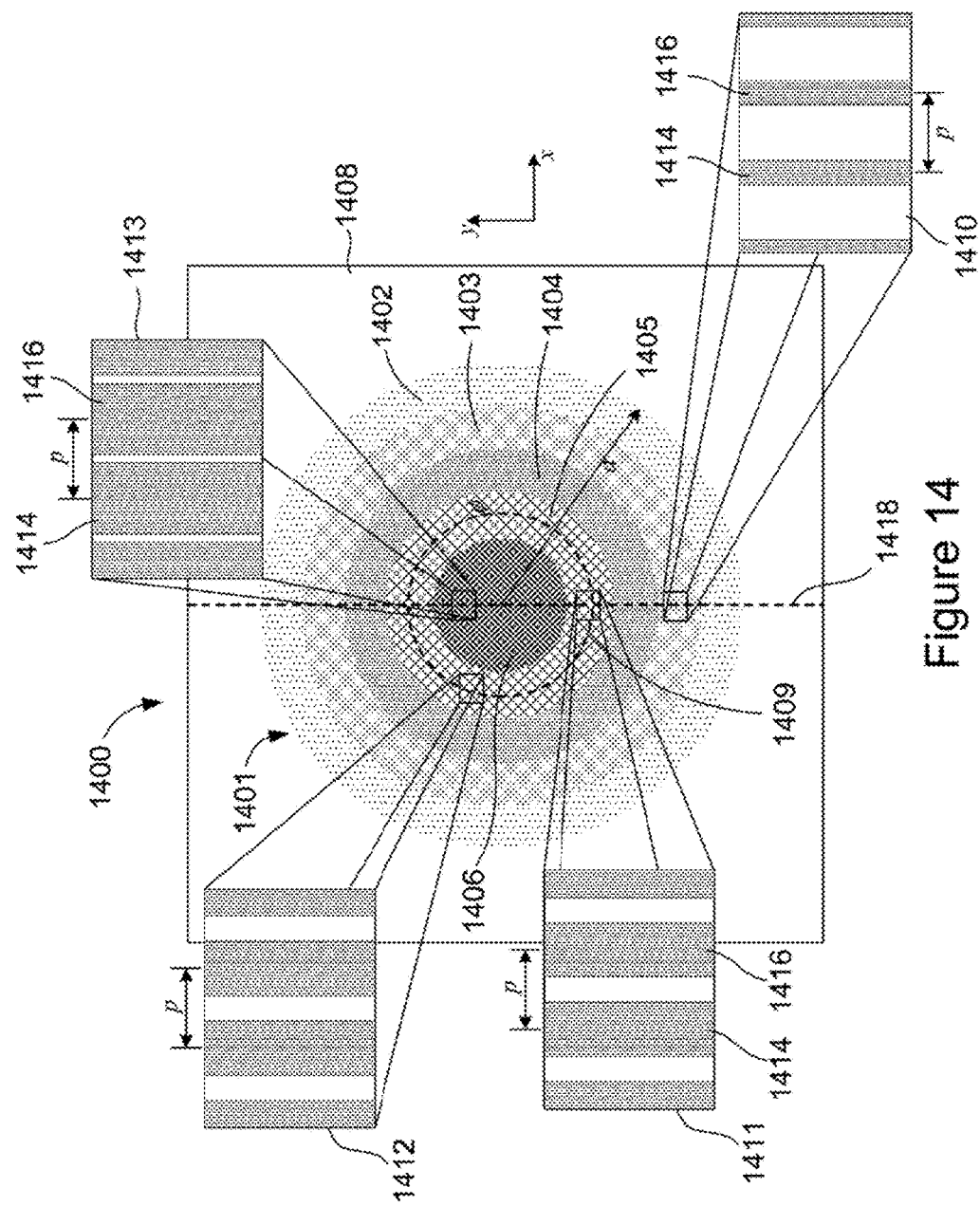
FIG. 14 shows a top plan view of a one-dimensional sub-wavelength grating configured to operate as a focusing spherical mirror in accordance with embodiments of the present invention.

In certain embodiments, a SWG with a constant period can be configured to operate as a spherical mirror for incident light polarized in a particular direction by tapering the lines of the grating layer away from the center of the SWG. FIG. 14 shows a top plan view of a one-dimensional SWG 1400 configured to operate as a focusing spherical mirror for incident light polarized in the x-direction in accordance with embodiments of the present invention. The SWG 1400 includes a grating layer 1401 represented by annular shaded regions 1402-1406. The grating layer 1401 can be composed of a material having a relatively higher refractive index than the substrate 1408. The grating layer 1401 defines a circular mirror aperture extending out from the origin with radius a. Each shaded annular region represents a different grating sub-pattern of lines formed in the grating layer 1401. The grating sub-patterns of the annular regions 1402-1406 have the same duty cycle as revealed in the four enlargements 1410-1413. The enlargements 1410-1413 show that the grating pattern formed in the grating layer 1401 comprises tapered lines running in the y-direction with a constant line period p in the x-direction. In particular, enlargements 1410, 1411, and 1413 are enlargements of the same lines 1414 and 1416 running parallel to dashed-line 1418 in the y-direction. Enlargements 1410, 1411, and 1413 show that the period p remains constant but the width of the lines 1414 and 1416 narrows away from the center of the grating layer 1401. Each annular region has the same duty cycle and period. For example, enlargements 1411 and 1412 reveal that annular region 1405 comprises portions of different lines that have substantially the same duty cycle. As a result, each portion of an annular region results in the same approximate phase shift in the light reflected from the annular region. For example, dashed circle 1409 represents a single phase shift contour in which light reflected from anywhere in the annular region 1405 acquires substantially the same phase ϕ.

Figure 15:
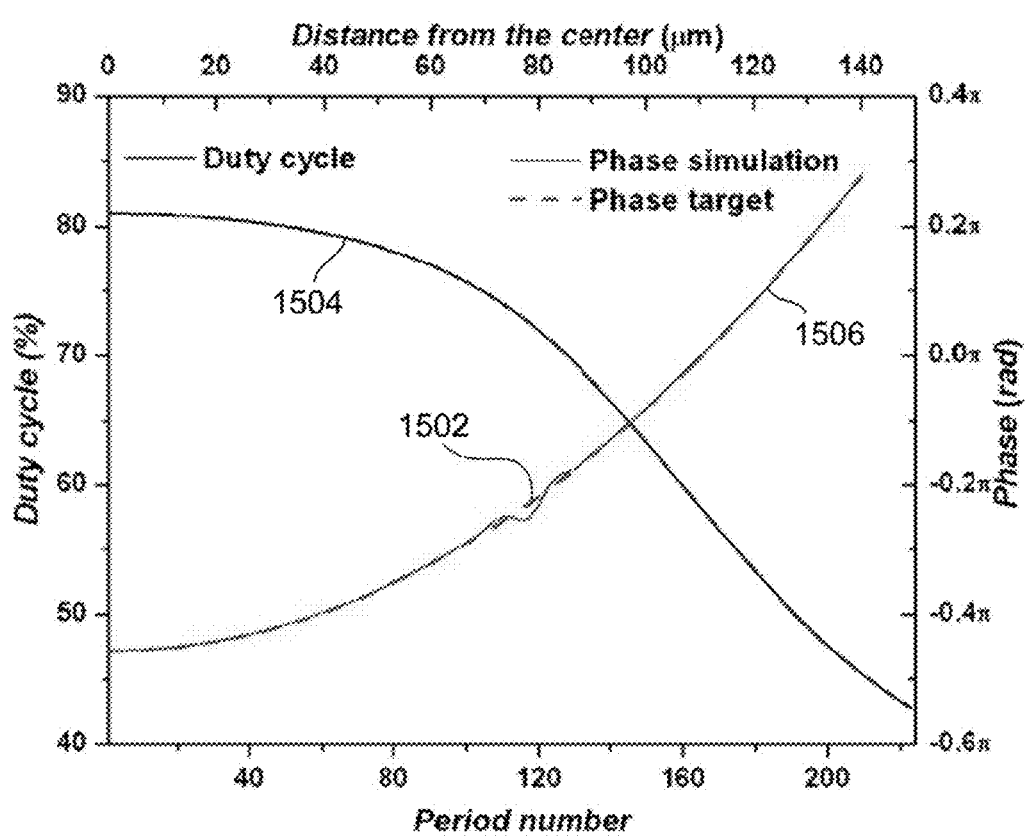
FIG. 15 shows an exemplary plot of a target phase change for a spherical mirror in accordance with embodiments of the present invention.

Fabrication of the SWG spherical mirror 1400 is analogous to fabrication of the SWG cylindrical mirror 1000 described above. Prior to fabricating the SWG spherical mirror 1400, a minimum reflectivity, focal length f, mirror aperture radius a, and preferred period range $p_{min}$ and $p_{max}$ are determined. Once the parameters for the SWG spherical mirror 1400 have been determined, a desired or target phase change across the mirror extending out from the center is selected. For a spherical focusing mirror, the target phase change across the SWG mirror can be determined according to the expression:

$$\phi(x) = \phi_0 + \frac{2\pi}{\lambda R_M} r_{rod}^2$$

where $\phi_0$ is the largest phase shift near the center of the mirror, $R_M$ is the spherical radius or curvature of the mirror, and $r_{rad}$ is the radius of the aperture from the center of the mirror with the constraints $0 \leq r_{rad} \leq a$ and $r_{rad}^2 = x^2 + y^2$. FIG. 15 shows an exemplary plot of the target phase $\phi(r_{rad})$ for a spherical mirror in accordance with embodiments of the present invention. In FIG. 15, dashed curve 1502 represents the desired or target phase change $\phi(r_{rad})$ across the mirror from the center of the mirror $r_{rad}=0$ to the edge of the aperture $r_{rad}=a$. The target phase change can be matched to the phase contour surface in the manner described above with reference to FIG. 10 in order to determine a period p, a duty cycle $\eta(r_{rad})$, and a look-up table of phases and duty cycle values as described above with reference to the look-up Table I. FIG. 15 also includes a curve 1504 representing the change in the duty cycle $\eta(r_{rad})$ as a function of $r_{rad}$.

Figure 16:
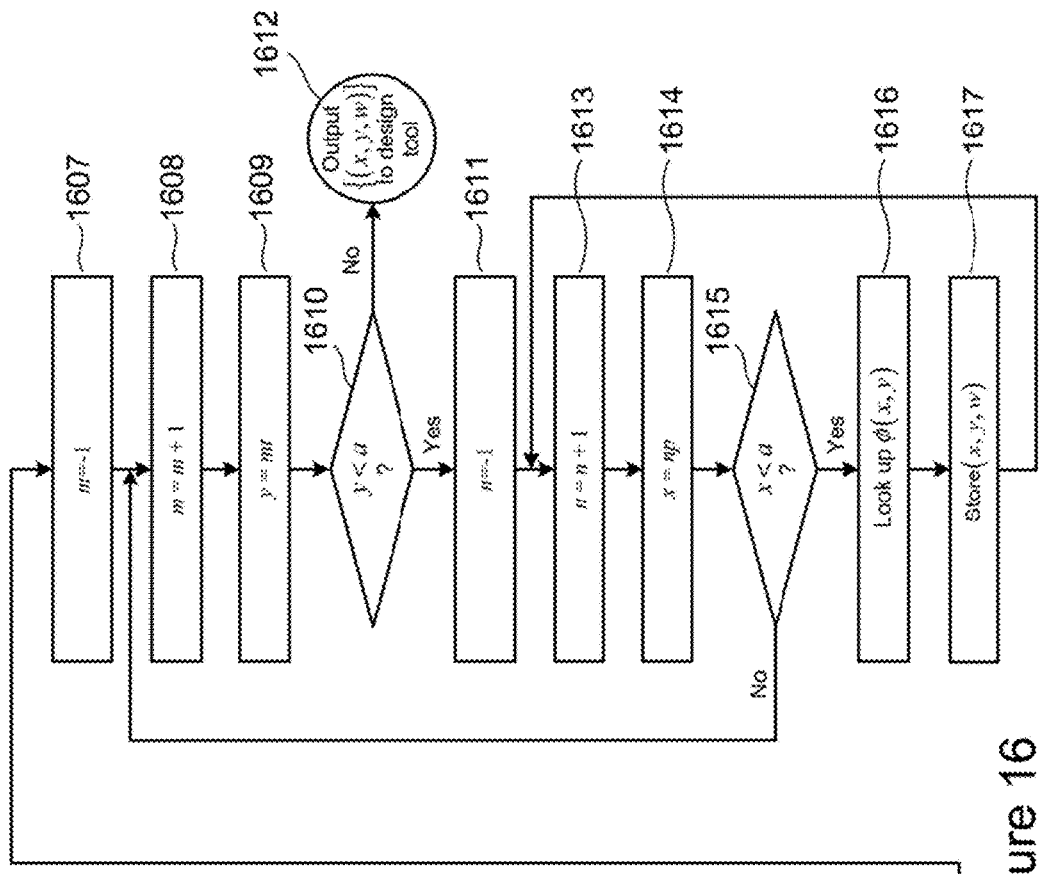
FIG. 16 shows a control-flow diagram of a method for generating a spherical mirror grating pattern for a focusing sub-wavelength grating spherical mirror in accordance with embodiments of the present invention.
Figure 16:
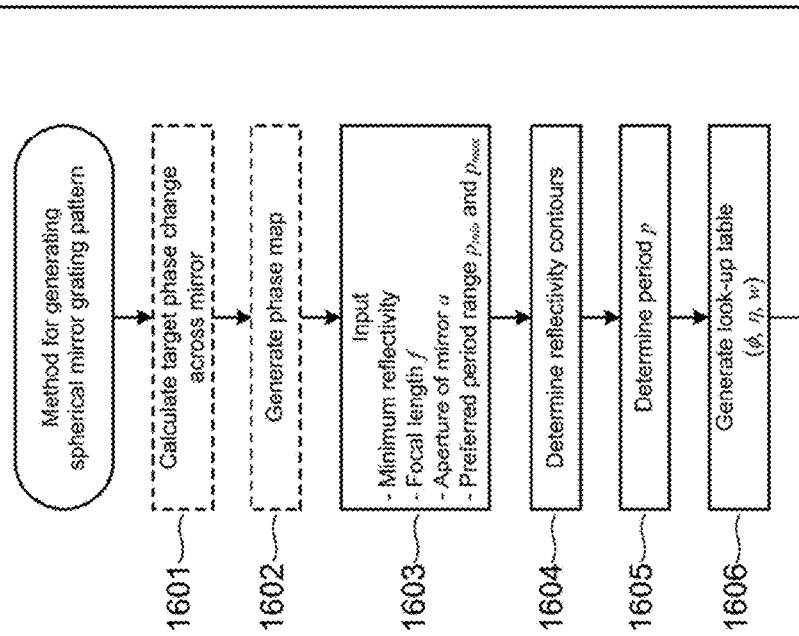

Methods for generating a spherical mirror grating pattern data are analogous to the methods for generating cylindrical mirror grating pattern data described above with reference to the control-flow diagram of FIG. 13, but with additional steps for accounting for tapering of lines in the y-direction. FIG. 16 shows a control-flow diagram of a method for generating a spherical mirror grating pattern for light polarized in the x-direction in accordance with embodiments of the present invention. Steps 1601 and 1602 are identical to steps 1301 and 1302, respectively, of the method described above with reference to FIG. 13. In step 1603, the minimum reflectivity, focal length, mirror radius a, and the preferred period range are input, as described above. In step 1604, the target phase change across the mirror along the radius $r_{rad}$ is calculated as described above with reference to FIG. 14. In step 1605, the period p is determined by matching the target phase change $\phi(r_{rad})$ with a portion of the phase contour map, shown in FIG. 8, with the constraints imposed by the minimum reflectivity and period range. In step 1606, a look-up table representing the phase $\phi(r_{rad})$ and the corresponding line width as a function of the radius $r_{rad}$ is determined. In step 1607, the number m is initialized to the integer value −1. In step 1608, m is incremented. In step 1609, the y-coordinate is determined by y=mt, where t is the period in the y-direction. In step 1610, when y is less than a, proceed to step 1611. Otherwise, proceed to step 1612. In step 1612, the data set created below in steps 1616 and 1618 is sent to the design tool for processing. In step 1611, the number n is initialized to the integer value −1. In step 1612, n is incremented. In step 1614, the x-coordinate is determined by x=np. In step 1615, when x is less than a, the method proceeds to step 1616. Otherwise, the method returns and repeats steps 1608-1614. In step 1616, for x and y determined in steps 1614 and 1609, respectively, the corresponding phase is determined from the look-up table determined in step 1606. In step 1618, the width w corresponding the phase in the look-up table is recorded in a data file along with the x and y coordinates.

IV. Implementation

Figure 17:
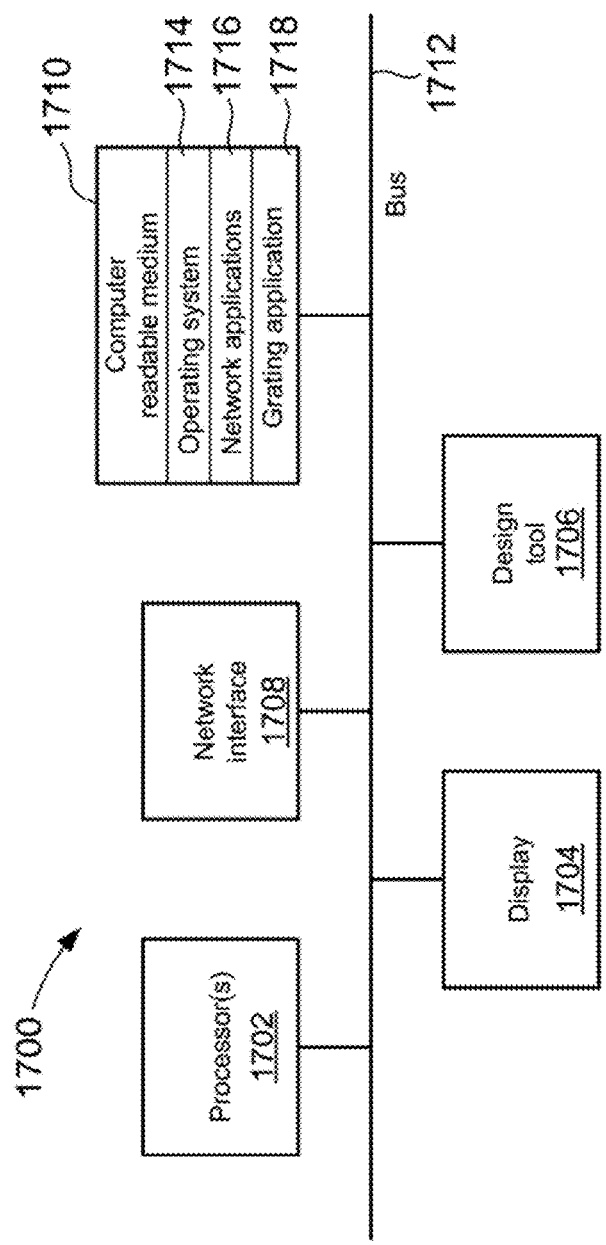
FIG. 17 shows a schematic representation of a computing device configured in accordance with embodiments of the present invention.

In general, the methods employed to generate SWG gating pattern data described above with reference to FIGS. 9, 13 and 16 can be implemented on a computing device, such as a desktop computer or a laptop. FIG. 17 shows a schematic representation of a computing device 1700 configured in accordance with embodiments of the present invention. The device 1700 includes one or more processors 1702, such as a central processing unit; one or more display devices 1704, such as a monitor; a design tool interface 1706; one or more network interfaces 1708, such as a Local Area Network LAN, a wireless 802.11x LAN, a 3G mobile WAN or a WiMax WAN; and one or more computer-readable mediums 1710. Each of these components is operatively coupled to one or more buses 1712. For example, the bus 1712 can be an EISA, a PCI, a USB, a FireWire, a NuBus, or a PDS.

The computer readable medium 1710 can be any suitable medium that participates in providing instructions to the processor 1702 for execution. For example, the computer readable medium 1710 can be non-volatile media, such as an optical or a magnetic disk; volatile media, such as memory; and transmission media, such as coaxial cables, copper wire, and fiber optics. Transmission media can also take the form of acoustic, light, or radio frequency waves. The computer readable medium 1710 can also store other software applications, including word processors, browsers, email, Instant Messaging, media players, and telephony software.

The computer-readable medium 1710 may also store an operating system 1714, such as Mac OS, MS Windows, Unix, or Linux; a network applications 1716; and a grating application 1718. The operating system 1714 can be multi-user, multiprocessing, multitasking, multithreading, real-time and the like. The operating system 1714 can also perform basic tasks such as recognizing input from input devices, such as a keyboard or a keypad; sending output to the display 1704 and the design tool 1706; keeping track of files and directories on medium 1710; controlling peripheral devices, such as disk drives, printers, image capture device; and managing traffic on the one or more buses 1712. The network applications 1716 includes various components for establishing and maintaining network connections, such as software for implementing communication protocols including TCP/IP, HTTP, Ethernet, USB, and FireWire.

The grating application 1718 provides various software components for generating grating pattern data, as described above. In certain embodiments, some or all of the processes performed by the application 1718 can be integrated into the operating system 1714. In certain embodiments, the processes can be at least partially implemented in digital electronic circuitry, or in computer hardware, firmware, software, or in any combination thereof.

V. Other Sub-Wavelength Gratings

Embodiments of the present invention are not limited to cylindrical and spherical mirrors configured to focus light polarized in a particular direction. In still other embodiments, SWGs can be configured to provide arbitrary phase front shape modulation. Embodiments of the present invention also include planar SWG mirrors that can be configured to operate as focusing spherical mirrors for light polarized in any direction.

Figure 18A:
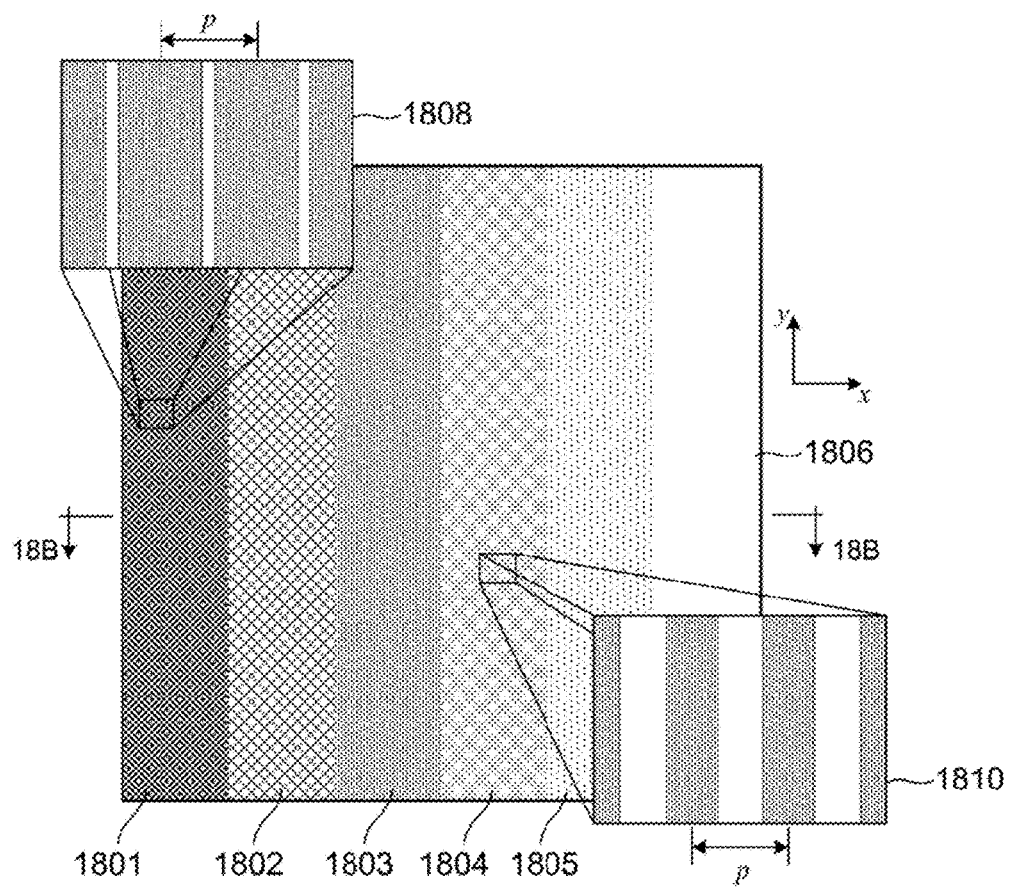
FIG. 18A shows a top plane view of a one-dimensional sub-wavelength grating configured to reflect normal incident light into a particular direction in accordance with embodiments of the present invention.
Figure 18B:
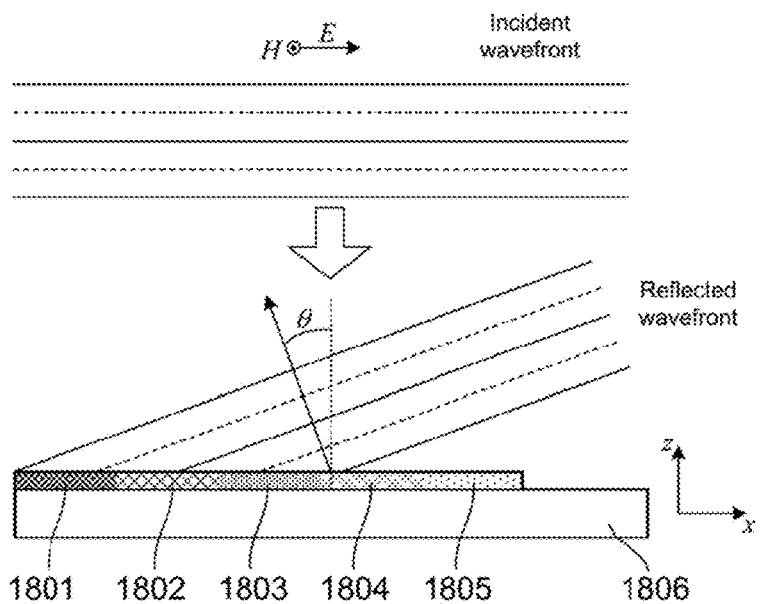
FIG. 18B shows a cross-sectional view of the sub-wavelength grating along a line 18B-18B, shown in FIG. 18A, operated in accordance with embodiments of the present invention.

In certain embodiments, SWGs can be configured as mirrors that reflect light with a particular direction away from the surface normal. FIG. 18A shows a top plan view of a one-dimensional SWG 1800 configured to reflect normal incident light polarized in the x-direction in accordance with embodiments of the present invention. The grating layer is composed of regions 1801-1806, with each region formed from lines extending in the y-direction, having the same period, but with the duty cycle progressively decreasing from the region 1801 to the region 1806. Enlargements 1808 and 1810 show sub-regions of regions 1801 and 1804 with the same period p and that region 1801 has a relatively larger duty cycle than region 1804. The duty cycles for the regions 1801-1806 are selected so that the resulting phase change in the reflected light is largest for the region 1801 and decreases linearly from the region 1801 to the region 1806. FIG. 18B shows a cross-sectional view of the SWG 1800 along a line 18B-18B, shown in FIG. 18A, operated in accordance with embodiments of the present invention. The phase change causes incident light polarized in the x-direction and directed normal to the first surface to be reflected with an angle θ away from the surface normal 1812.

Figure 19A:
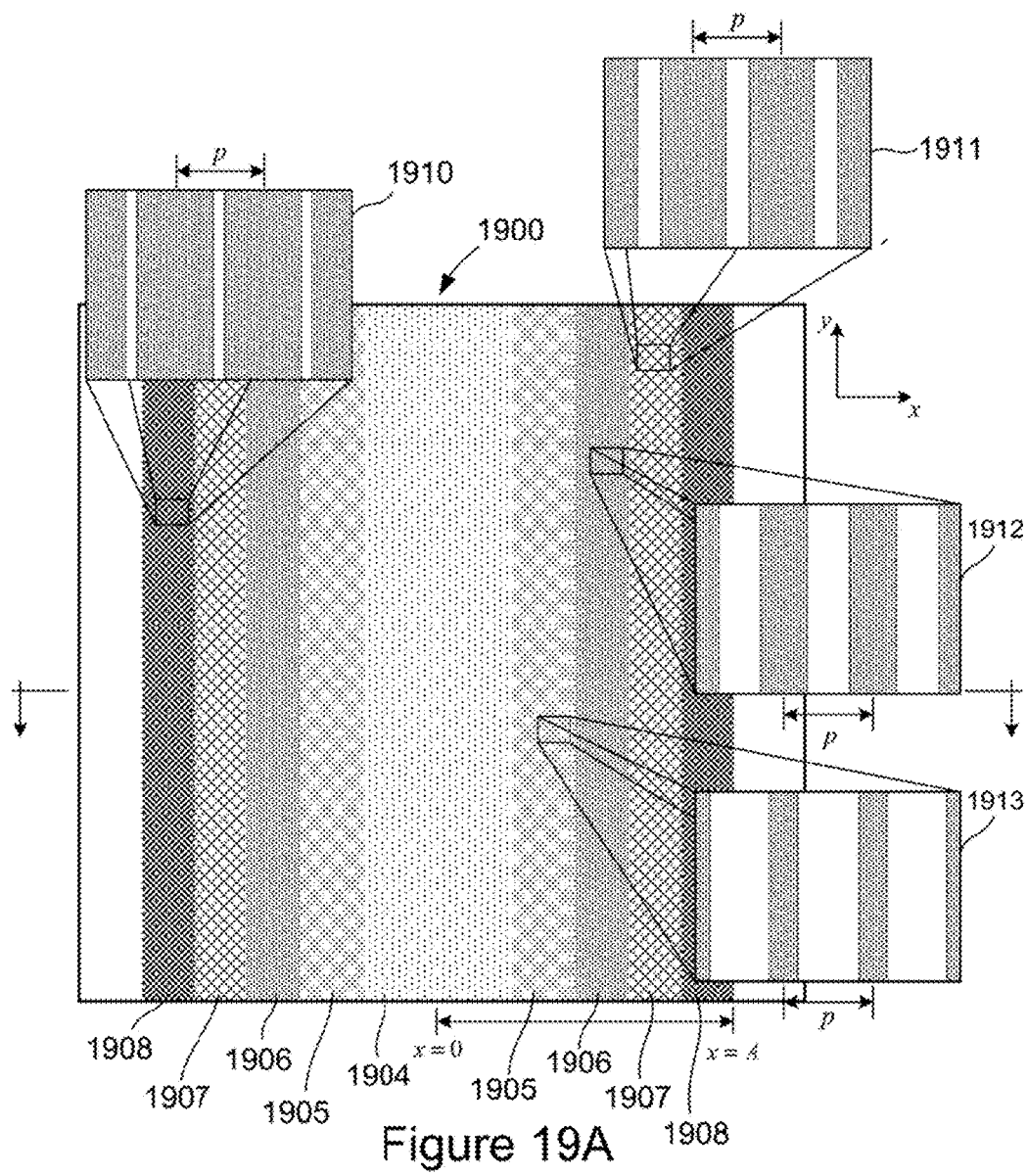
FIG. 19A shows a top plan-view of a one-dimensional sub-wavelength grating configured to operate as a diverging cylindrical mirror for incident light polarized parallel to the x-direction in accordance with embodiments of the present invention.
Figure 19B:
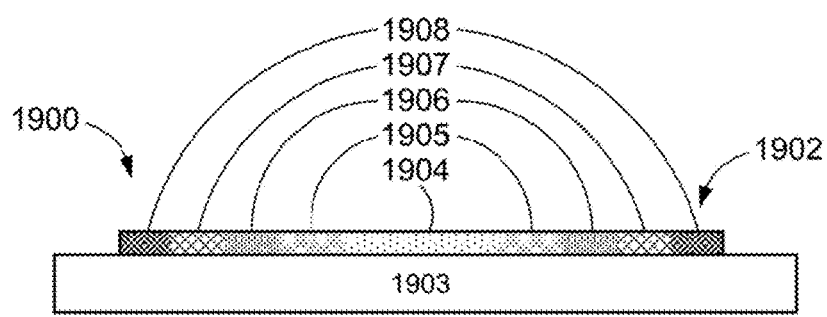
FIG. 19B shows a cross-sectional view of the sub-wavelength grating along a line 19B-19B, shown in FIG. 19A, in accordance with embodiments of the present invention.

In other embodiments, SWGs can be configured to operate as a diverging mirror by imprinting an appropriate grating pattern in the grating layer with a duty cycle that increases away from the center of the SWG. For example, FIG. 19A shows a top plan-view of a one-dimensional SWG 1900 configured to operate as a diverging cylindrical mirror for incident light polarized in the x-direction in accordance with embodiments of the present invention. FIG. 19B shows a cross-sectional view of the SWG 1900 along a line 19B-19B, shown in FIG. 19A, in accordance with embodiments of the present invention. As shown in FIG. 19B, the SWG 1900 comprises a grating layer 1902 disposed on a surface of a substrate 1903. The grating layer 1902 defines a mirror aperture extending the length of the SWG 1900 in the y-direction and having a length 2A in the x-direction. FIGS. 19A-19B include shaded regions 1904-1908 of the grating layer 1902 that are the reverse order of the shaded regions 904-908 shown in FIG. 9. For example, enlargements 1910-1913 show that the duty cycle η increases away from the center x=0. The grating layer 1902 is configured to cause reflected light polarized in the x-direction to diverge, as described above with reference to FIG. 6B. The diverging SWG cylindrical mirror 1900 can be fabricated in the same manner as the focusing SWG cylindrical mirror 900 but with the target phase described above with reference to FIG. 11 equal to −ϕ(x). In other embodiments, divergent SWG spherical mirrors can be also be obtained by reversing order of the shaded regions.

In other embodiments, SWGs can be configured with a two-dimensional grating pattern by patterning in the x- and y-directions, as described above with reference to FIGS. 9, 13, and 16.

VI. Results

Figure 20:
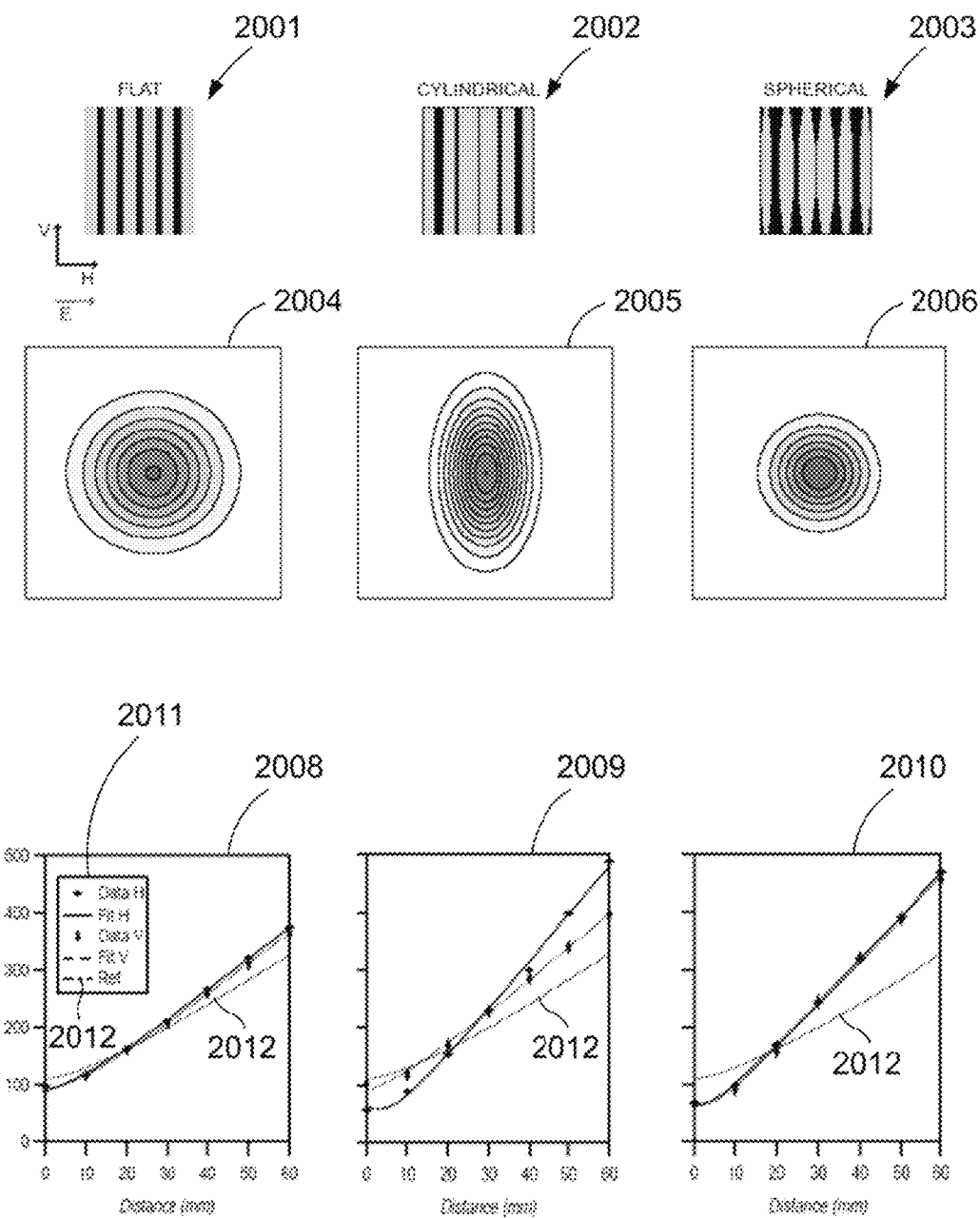
FIG. 20 shows beam profiles and reflected beam radii for flat, cylindrical, and spherical sub-wavelength grating mirrors fabricated in accordance with embodiments of the present invention.

FIG. 20 shows schematic representations of line distributions for flat 2001, cylindrical 2002, and spherical 2003 SWG mirrors configured in accordance with embodiments of the present invention. Flat, cylindrical, and spherical SWG mirrors were fabricated with a period of 670 nm in a 450 nm thick amorphous Si layer disposed on a quarts substrate, with a minimum reflectance of 98%. For the flat and cylindrical SWG mirrors 2001 and 2002, the lines are rectangular. For the spherical SWG mirror, the width of each line is tapered, as described above with reference to FIG. 13. FIG. 20 includes contour plots of measured reflected beam profiles 2004-2006 corresponding to the SWG mirrors 2001-2003, respectively, for incident light polarized perpendicular to the lines. The beam profiles 2004-2006 are produced for the same incident Gaussian-shaped beam. The flat SWG 2001 produces a Gaussian-shaped beam profile 2004 that is substantially the same as the beam profile of the incident Gaussian-shaped beam. The reflected beam profile is relatively broader than the beam profiles 2005 and 2006. The beam profile 2005 indicates the cylindrical SWG 2002 reflects a Gaussian-shaped beam that is narrowed in the direction perpendicular to the lines (the "H" direction), and unchanged in the direction parallel to the lines (the "V" direction). The beam profile 2006 reveals that the spherical SWG 2003 produces a narrower Gaussian-shaped reflected beam in all directions than the flat SWG mirror 2001 and a narrower reflected beam in the V direction than the cylindrical mirror 2002. In summary, the flat SWG 2001 does not focus but merely reflects incident light. The cylindrical SWG 2002 focuses reflected light perpendicular to the lines. And the tapered lines of the spherical SWG 2003 enable the spherical SWG 2003 to focus independent of the line direction.

FIG. 20 also includes plots 2008-2010 of reflected beam radii as a function of distance from the three types of mirrors. The zero in the distance axis corresponds to the position of the waist of the reflected beam. The horizontally and vertically direction diamonds, represented in legend 2011, correspond to measured beam radius of the reflected beam along the H direction and V direction, respectively, and the continuous lines passing through the diamonds in each plot are best fits. The line 2012 represents the radius of the beam reflected from a plane mirror and is included for comparison. Plots 2008 and 2010 show that the reflected beam radii along H and V directions for the flat and spherical SWGs are nearly indistinguishable, while the spherical SWG gives a smaller beam spot for the same incident, indicating a focusing power along both H and V directions as designed. On the other hand, for the cylindrical SWG, the reflected beam radii along the H direction is narrower for relatively shorter distances and broader for relatively longer distances than that in the V direction. This indicates that the mirror gives focusing power along the H direction only, which is also predicted by the design.

Beam parameters were reconstructed from the measured beam radii at various positions. Using these beam parameters, the mirror focal length was determined to be 20±3 mm for the cylindrical and spherical mirrors, which is close to the design value of 17.2 mm. The reflectivity of the mirrors was in the range of 80-90%, lower than the expected 98%. This discrepancy is likely due to the feature size deviation from the design because of the proximate effects in the electron beam lithographic step, as well as surface roughness of the Si lines.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A method for fabricating a grating mirror using a computing device, the method comprising:
calculating a target phase change across the grating mirror using the computing device, the target phase change corresponding to a target wavefront shape in a beam of light reflected from a grating pattern;
generating the grating pattern comprising a plurality of lines with line widths, line period spacings, and line thicknesses corresponding to the target phase change across the grating mirror using the computing device; and generating a set of coordinates using the computing device, each coordinate identifying a location of a line of the plurality of lines, a line width of the line, a line period spacing of the line, and a line thickness of the line.

2. The method of claim 1 further comprising:

inputting the set of coordinates into a micro-chip processing tool;

depositing a first layer of material on a surface of a substrate using chemical vapor deposition, the first layer of material having a relatively higher refractive index than the substrate; and defining the grating pattern in the first layer of material using lithography based on the set of coordinates.

3. The method of claim 2 wherein the grating pattern further comprises a pattern of tapered lines disposed on the surface of the substrate.

4. The method of claim 2 wherein the grating pattern further comprises a pattern of rectangular-shaped lines disposed on the surface of the substrate.

5. The method of claim 1 further comprising:

identifying a portion of a phase contour surface associated with a minimum reflectivity selected for the grating mirror; and determining the grating pattern line period spacings using the computing device based on the target phase change matching the portion of the phase contour surface.

6. The method of claim 1 wherein the lines widths and line thicknesses are substantially constant and the line period spacings are variable based on the target phase change.

7. The method of claim 1 wherein the grating pattern comprises a plurality of different grating sub-patterns and each of the plurality of different grating sub-patterns are oriented in a same direction.

8. The method of claim 7 wherein each of the plurality of different grating sub-patterns comprises a unique pattern of periodically spaced lines to control a phase change in a respective portion of the beam of light reflected from the grating pattern to achieve the target phase change.

9. The method of claim 7 wherein each of the plurality of different grating sub-patterns corresponds to a different target phase change.

10. The method of claim 1 wherein the grating pattern produces a target wavefront shape and forms a mirror to focus the reflected light beam to a focal point.

11. A method for fabricating an optical device, the method comprising:

calculating, via a computing device, a target phase change across the optical device;

generating a grating pattern having a planar geometry and comprising a plurality of different grating sub-patterns, each of the plurality of different grating sub-patterns oriented in the same direction to implement the target phase change, wherein the target phase change corresponds to a target wavefront shape in a beam of light reflected from the grating pattern; and generating, via the computing device, a set of coordinates to implement the grating pattern.

12. The method of claim 11 further comprising:

inputting the set of coordinates into a micro-chip processing tool;

depositing a first layer of material on a surface of a substrate using chemical vapor deposition, the first layer of material having a relatively higher refractive index than the substrate; and defining the grating pattern in the first layer of material using lithography based on the set of coordinates.

13. The method of claim 12 wherein the grating pattern further comprises a pattern of tapered lines disposed on the surface of the substrate.

14. The method of claim 12 wherein the grating pattern further comprises a pattern of rectangular-shaped lines disposed on the surface of the substrate.

15. The method of claim 11 wherein each of the plurality of different grating sub-patterns comprises a unique pattern of periodically spaced lines.

16. The method of claim 15 wherein the unique pattern comprises differing line widths, line thicknesses, or line period spacings.

17. The method of claim 15 wherein the lines widths and line thicknesses are substantially constant and the line period spacings are variable based on the target phase change.

18. The method of claim 11 further comprising:

identifying a portion of a phase contour surface associated with a minimum reflectivity selected for the optical device; and determining, using the computing device, a line period spacing for the grating sub-pattern based on the target phase change matching the portion of the phase contour surface.

19. The method of claim 11 wherein each of the plurality of different grating sub-patterns corresponds to a different target phase change.

20. The method of claim 11 wherein each of the plurality of different grating sub-patterns corresponds to a different target phase change.

* * * * *